(12) United States Patent
Zhang et al.

(10) Patent No.: US 9,699,611 B1
(45) Date of Patent: Jul. 4, 2017

(54) RELATIVE FORWARD LINK CALIBRATION ESTIMATION

(71) Applicant: QUALCOMM Incorporated, San Diego, CA (US)

(72) Inventors: Gengsheng Zhang, Cupertino, CA (US); Rayman Wai Pon, Cupertino, CA (US); Ju-Yong Do, Cupertino, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/986,893

(22) Filed: Jan. 4, 2016

(51) Int. Cl.
*H04W 24/00* (2009.01)
*H04W 4/02* (2009.01)
*G06F 17/50* (2006.01)
*H04W 24/08* (2009.01)

(52) U.S. Cl.
CPC .......... *H04W 4/023* (2013.01); *G06F 17/509* (2013.01); *H04W 24/08* (2013.01)

(58) Field of Classification Search
None
See application file for complete search history.

(56) References Cited

U.S. PATENT DOCUMENTS

| 6,636,744 B1 * | 10/2003 | Da | G01S 1/026 342/357.29 |
| 7,868,826 B1 | 1/2011 | Hou et al. | |
| 2006/0009235 A1 | 1/2006 | Sheynblat et al. | |
| 2007/0161379 A1 | 7/2007 | Morisaki | |
| 2007/0252761 A1 | 11/2007 | Koorapaty et al. | |
| 2011/0043406 A1 | 2/2011 | Duffett-Smith et al. | |
| 2015/0350850 A1 | 12/2015 | Edge | |

FOREIGN PATENT DOCUMENTS

| JP | 4971418 B2 | 7/2012 |
| WO | 2014124106 A1 | 8/2014 |

OTHER PUBLICATIONS

International Search Report and Written Opinion—PCT/US2016/059859—ISA/EPO—Feb. 23, 2017—15 pgs.

* cited by examiner

*Primary Examiner* — Suhail Khan
(74) *Attorney, Agent, or Firm* — Hunter Clark PLLC

(57) ABSTRACT

Techniques for determining a relative Time Calibration (dTcal) value for a mobile device model are disclosed. An example of an apparatus according to the disclosure includes a memory, a receiver configured to receive measurements and a mobile device model information from mobile devices disposed in geographic areas, a processor configured to determine a baseline mobile device model and other mobile devices models based on the measurements, calculate a baseline measurement value based on the measurement values that correspond to the baseline mobile device model, determine difference values based on the baseline measurement value and the other mobile device model measurement values, determine a model specific dTcal value based on the difference values for at least one of the other mobile device models, and store the model specific dTcal value in the memory.

16 Claims, 15 Drawing Sheets

Grid 1 with device model A and device model B

RELATIVE FORWARD LINK CALIBRATION ESTIMATION

BACKGROUND

It is often desirable to know the location of a mobile device such as a cellular phone. For example, a location services (LCS) client may desire to know the location of a mobile device in the case of an emergency services call or to provide some service to the user of the mobile device such as navigation assistance or direction finding. The terms "location" and "position" are synonymous and are used interchangeably herein. One method of determining the location of mobile device is based on measurements of the times of signal arrival from multiple antennas. For example, a mobile device may measure time differences in received signals from a plurality of base station antennas. Because positions of the base station antennas are known, the observed time differences may be used to calculate the location of the mobile device. An mobile device may make use of a Base Station Almanac (BSA) to perform measurement calculations and/or may send the measurements to a location server for position calculation. The term Advanced Forward Link Trilateration (AFLT) is used to describe terrestrial positioning in Code Division Multiple Access (CDMA) systems, while the term Observed Time Difference of Arrival (OTDOA) is used in the context of Wideband CDMA (WCDMA) and Long Term Evolution (LTE) systems. The accuracy in terrestrial positioning is dependent on synchronization of base station clocks and signal transmissions. Variations in hardware and installation procedures may cause a time bias for a cell signal and decrease the accuracy the positioning estimate.

SUMMARY

An example of an apparatus for determining a relative Time Calibration (dTcal) value for a mobile device model according to the disclosure includes a memory, a receiver configured to receive measurements (e.g., Time of Arrival (TOA)) and a mobile device model information from a plurality of mobile devices disposed in one or more geographic areas, at least one processor operably coupled to the memory and the receiver, configured to determine a baseline mobile device model and other mobile devices models based on the measurements, such that the mobile devices consist of the baseline mobile device model and the other mobile device models, calculate a baseline measurement value based on the measurements that correspond to the baseline mobile device model, determine difference values based on the baseline measurement value and the other mobile device models measurement values, calculate a model specific dTcal value based on the difference values for at least one of the other mobile device models, and store the model specific dTcal value in the memory.

Implementations of such an apparatus may include one or more of the following features. The at least one processor may be further configured to calculate a model specific dTcal uncertainty value as a standard deviation of the plurality difference values for the at least one of the other mobile device models, and store the model specific dTcal uncertainty value in the memory. The at least one processor may be configured to determine a device model with a high number of measurements as the baseline mobile device model. The geographic areas may be a grid located in proximity to a cellular transceiver. The geographic areas may be one or more areas corresponding to a received signal strength value. The at least one processor may be further configured to generate a Forward Link Calibration (FLC) Group identification based on the baseline mobile device model. A transmitter may be configured to transmit the model specific dTcal value to the at least one of the other mobile device models. The at least one processor may be further configured to determine a base station antenna location based at least in part on the model specific dTcal value.

An example of a method for determining a relative Time Calibration (dTcal) value for a mobile device model according to the disclosure includes receiving measurements and mobile device model information from mobile devices disposed in a geographic areas, determining a baseline mobile device model and other mobile devices models based on the measurements, such that the mobile devices consist of the baseline mobile device model and the other mobile device models, calculating a baseline measurement value based on the measurement values that correspond to the baseline mobile device model, determine difference values based on the baseline measurement value and the other mobile device model measurement values, determine a model specific dTcal value based on the difference values for at least one of the other mobile device models, and storing the model specific dTcal value.

Implementations of such a method may include one or more of the following features. Calculating a model specific dTcal uncertainty value as a standard deviation of the difference values for the at least one of the other mobile device models and storing the model specific dTcal uncertainty value. Determining the baseline mobile device model may include determining a device model with a high number of measurements. The geographic areas may be a grid located in proximity to a cellular transceiver. The geographic areas may be one or more areas corresponding to a received signal strength value. A Forward Link Calibration (FLC) Group identification may be generated based on the baseline mobile device model. The model specific dTcal value may be transmitted to the at least one of the other mobile device models. A base station antenna location may be determined based at least in part on the model specific dTcal value.

An example of a mobile device according to the disclosure includes a memory, a wireless transceiver configured to receive timing measurement information, at least one processor operably coupled to the memory and the wireless transceiver, configured to determine a relative Forward Link Calibration (FLC) value for the timing measurement information, such that the relative FLC value is based at least in part on a mobile device model type, compensate the timing measurement information with the corresponding relative FLC values, and calculate an estimated location based at least in part on the compensated timing measurement information.

Implementations of such a mobile device may include one or more of the following features. The wireless transceiver may be further configured to provide a cellular transceiver identification information to a location server, and receive the relative FLC value from the location server, such that the FLC value is associated with the cellular transceiver identification information. The wireless transceiver may be configured to receive a FLC Group identification associated with the cellular transceiver identification information. The at least one processor may be configured to determine a set of timing measurement values based on the FLC Group identification. The estimated location may be based on the set of timing measurement values. The relative FLC value may be based at least in part on one or more timing measurement connection parameters. The one or more timing measurement connection parameters may be at least one of a connection mode, a channel, a bandwidth, and a frequency.

An example of a method of determining an estimated location of a mobile device according to the disclosure includes determining timing measurements with the mobile device, determining a relative Forward Link Calibration (FLC) value for the timing measurements, such the relative FLC value is based at least in part on a mobile device model type, compensating the timing measurements with the corresponding relative FLC values, and calculating the estimated location of the mobile device with the compensated timing measurements.

Implementation of such a method may include one or more of the following features. Determining the relative FLC value may include providing a cellular transceiver identification information to a location server, and receiving the relative FLC value from the location server, such that the FLC value is associated with the cellular transceiver identification information. A FLC Group identification associated with the cellular transceiver identification information may be received. A set of timing measurement values based on the FLC Group identification may be determined. The estimated location of the mobile device may be based on the set of timing measurement values. The relative FLC value may be based at least in part on one or more timing measurement connection parameters. The one or more timing measurement connection parameters may include at least one of a connection mode, a channel, a bandwidth, and a frequency.

An example of an apparatus for determining a relative Time Calibration (dTcal) value for a mobile device model according to the disclosure includes means for receiving measurements and mobile device model information from mobile devices disposed in a geographic areas, means for determining a baseline mobile device model and other mobile devices models based on the measurements, such that the mobile devices consist of the baseline mobile device model and the other mobile device models, means for calculating a baseline measurement value based on the measurements that correspond to the baseline mobile device model, means for determining difference values based on the baseline measurement value and the other mobile device model measurement values, means for determining a model specific dTcal value based on the difference values for at least one of the other mobile device models, and means for storing the model specific dTcal value.

An example of an apparatus for determining an estimated location of a mobile device according to the disclosure includes means for determining timing measurements with the mobile device, means for determining a relative Forward Link Calibration (FLC) value for the timing measurements, such the relative FLC value is based at least in part on a mobile device model type, means for compensating the timing measurements with the corresponding relative FLC values, and means for calculating the estimated location of the mobile device with the compensated timing measurements.

An example of a non-transitory processor-readable storage medium comprising instructions for determining a relative Time Calibration (dTcal) value for a mobile device model according to the disclosure includes code for receiving measurements and mobile device model information from mobile devices disposed in a geographic areas, code for determining a baseline mobile device model and other mobile devices models based on the measurements, such that the mobile devices consist of the baseline mobile device model and the other mobile device models, code for calculating a baseline measurement value based on the measurements that correspond to the baseline mobile device model, code for determining difference values based on the baseline measurement value and the other mobile device model measurement values, code for determining a model specific dTcal value based on the difference values for at least one of the other mobile device models, and code for storing the model specific dTcal value.

An example of a non-transitory processor-readable storage medium comprising instructions for determining an estimated location of a mobile device according to the disclosure includes code for determining timing measurements with the mobile device, code for determining a relative Forward Link Calibration (FLC) value for the timing measurements, such the relative FLC value is based at least in part on a mobile device model type, code for compensating the timing measurements with the corresponding relative FLC values, and code for calculating the estimated location of the mobile device with the compensated timing measurements.

Items and/or techniques described herein may provide one or more of the following capabilities, and/or other capabilities not mentioned. Mobile devices may exchange timing information (e.g., Time of Arrival (TOA) information) with a cellular transceiver. Crowdsourcing data including TOA measurements and location information may be provided from one or more devices to an almanac. The TOA information is analyzed based on the location of the mobile device and the mobile device model type. A baseline mobile device model type may be selected for a geographic region. TOA measurement data is sorted based on grid cells. One or more relative Time Calibration (dTcal) values are determined for the mobile device model types. Reverse positioning is conducted to estimate the cellular transceiver's location and determine a FLC value. The FLC value is relative to the baseline mobile device and varies if other baseline models are selected. FLC Groups are identified in cells with the same baseline mobile device model type. A FLC Group indication is stored in the almanac. The relative FLC values may be used to compensate TOA measurements collected for forward positioning of a mobile device. Two or more dTcal values associated with different mobile device types may be stitched together to determine a relative FLC value for respective pairs of mobile device types. Other capabilities may be provided and not every implementation according to the disclosure must provide any, let alone all, of the capabilities discussed.

BRIEF DESCRIPTION OF DRAWINGS

Non-limiting and non-exhaustive aspects are described with reference to the following figures, wherein like reference numerals refer to like parts throughout the various figures unless otherwise specified.

DETAILED DESCRIPTION

Some example techniques are presented herein which may be implemented in various method and apparatuses in a wireless network to possibly provide for or otherwise support positioning techniques for a mobile device.

The location of a mobile device in a wireless network may be determined based on measurements of the times of signal arrival from multiple base station antennas. The accuracy of terrestrial positioning techniques may be dependent on synchronization of base station clocks and signal transmissions. Variations in hardware, however may cause variations in inter-cell synchronization on the order of hundreds of nanoseconds. A mobile device may obtain a measure of time synchronization of a forward link cell signal by comparing the transmission related times (e.g., Time of Arrival (TOA)) of a cell signal with a GNSS time associated with a calculated GNSS position, and using the known position of the cell transmitter(s). A time of arrival bias for the cell signal may be determined. Determination of the time bias for a cell signal is known as Forward Link Calibration (FLC). A FLC estimation is used in terrestrial positioning to ensure the Time of Arrival (TOA) measurements from different stations in a network can be aligned. In an embodiment, FLC values may be determined for different pairs of base stations in a communication network, such as described in U.S. patent application Ser. No. 14/146,682, filed on Jan. 2, 2014, and titled "Determination of Differential Forward Link Calibration in LTE Networks for Positioning," the contents of which are incorporated herein by reference. FLC estimation requires known Time Calibration (Tcal) values associated with the mobile device. In general, Tcal values are time offsets in a time of arrival solely due to RF, analog, and digital (basebase or other) processing in the receiver in a mobile device. The Tcal may be the difference between total time delay introduced for time of arrivals of network signals used for ranging and delay introduced for time of arrivals of GNSS signals. In operation, Tcal is determined by many factors, including the hardware used (antenna, pre-filtering, baseband processing), the firmware for low level processing, and the measurement engine software. Other factors such as temperature, voltage changes, bandwidths, and frequencies used may impact the Tcal value. A Tcal value may be measured for a particular device, but it is not cost effective for a mobile device manufacturer to measure a Tcal value for every mobile device it ships.

Figure 1:
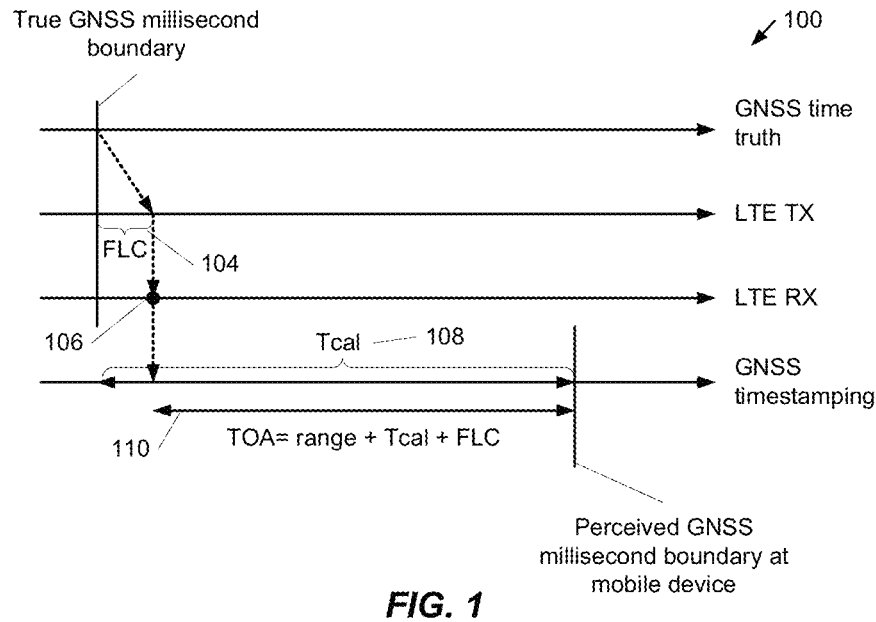
FIG. 1 is a graphical representation of a Forward Link Calibration (FLC) and a Time Calibration (Tcal) when the range is zero.

Referring to FIG. 1, a graphical representation 100 of the FLC and the Tcal when the range is zero is shown. The graphical representation 100 illustrates the relative FLC and Tcal values which individually represent time biases on a base station (e.g., eNB) and a mobile device, relative to GPS timing. FLC is defined as base station transmission time latency relative GNSS timing. In FIG. 1, an exemplary LTE eNB is intending to transmit subframes at every millisecond, but the actual transmission may not be exactly aligned with GPS millisecond (ms) boundary due to cable delay or other processing delays. For example, if the FLC=100 nanoseconds (e.g., FLC 104), then a LTE frame is sent 100 nanoseconds (ns) late after GNSS ms boundary. Typical FLC ranges include up to −100 ns for FLC calibrated eNBs, but are not limited in non-calibrated eNBs.

In an example, the Tcal is defined as the group delay difference of the exemplary LTE receiver minus that of a GNSS receiver, where the group delay includes all RF and digital component delays. For example, if an example Tcal=−21 microseconds (e.g., Tcal 108), the GPS receiver's time notion is 21 microseconds (μs) later than the exemplary LTE receiver's time notion such that a LTE timestamp=0 sec corresponds to GPS timestamp=−21 us.

Based on these definitions, FIG. 1 illustrates how the FLC and Tcal values impact TOA measurement and range estimation. An example GNSS timestamped TOA measurement at the mobile is given as follows:

TOA=range+Tcal+FLC+measurement errors;

where both Tcal and FLC are additive terms.

In an example, if the FLC=100 ns (e.g., FLC 104) and the Tcal=−21 μs (e.g., Tcal 108), this implies that an LTE subframe is sent 100 ns late and was GNSS timestamped early by 21 μs, thus, TOA=range−20.9 μs+measurement error.

To determine the range (e.g., a range estimate (rangeEst)), the TOA measurement is compensated with the FLC and the Tcal values:

rangeEst=TOA−TCAL−FLC.

In reverse positioning applications, where the Tcal is known, TOA information is compensated with the Tcal value, and the FLC value is estimated. In forward positioning applications, where the FLC is known, TOA information is compensated with the FLC value, and Tcal value is estimated.

Referring again to the example in FIG. 1, the FLC=100 ns (e.g., FLC 104) and Tcal=−21 μs (e.g., Tcal 108). A range of zero 106 is assumed for simplification (e.g., a mobile device is colocated at the eNB). A LTE transmissions from the eNB is delayed by the FLC 104 (e.g., 100 ns after GNSS ms boundary). The source of the 100 ns delay may be due to hardware configurations such as cable lengths. Since the range of zero 106 is used, the mobile device receives the LTE subframe immediately (e.g., at 100 ns) and conducts GNSS time stamping. A GNSS receiver has a larger group delay value (i.e., a GNSS clock is late compared to a LTE modem clock with Tcal=−21 μs) and thus generates timestamp 21 μs early. As a result, a first TOA measurement 110 is determined as:

TOA=range+Tcal+FLC;

TOA(modulo 1 ms)=0+100 ns−21 μs;

TOA=−20900 ns.

Figure 2:
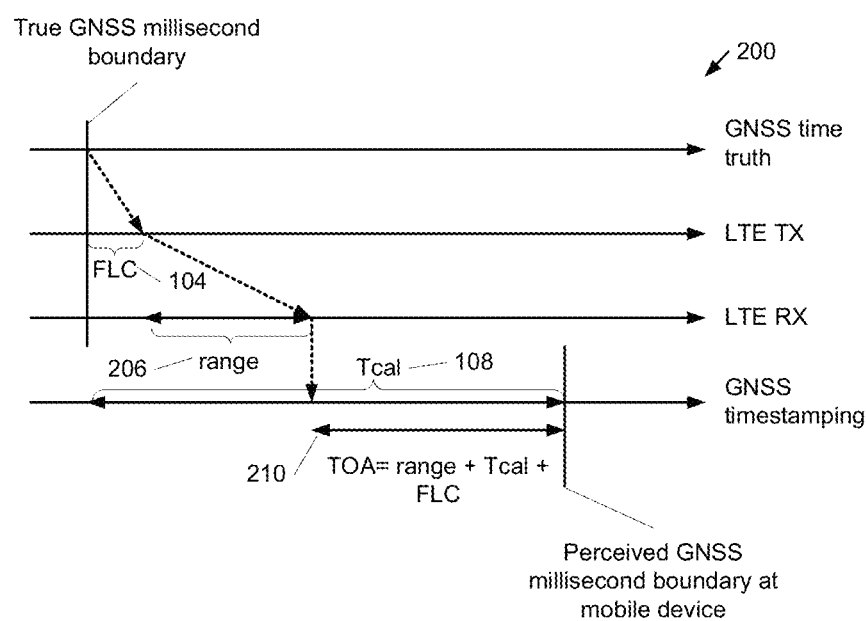
FIG. 2 is a graphical representation of the Forward Link Calibration (FLC) and the Time Calibration (Tcal) with an example range greater than zero.

Referring to FIG. 2, with further reference to FIG. 1, a graphical representation 200 of the FLC and the Tcal with an example range greater than zero is shown. FIG. 2 includes a range value 206. The range value is exemplary only, and not a limitation. In this example, the range value 206 indicates that the mobile device is 1.5 km from base station (e.g., eNB). A range of 1.5 km is approximately equivalent to 5 μs. Utilizing the FLC 104 and Tcal 108 described in FIG. 1, a second TOA measurement 210 is determined as:

TOA(modulo 1 ms)=5 μs+100 ns−21 μs=−15900 ns.

In a forward positioning application, where the TOA is measured, the range estimated may be determine as:

rangeEst=TOA−TCAL−FLC rangeEst=−15900 ns−(−21 μs)−100 ns=5 μs.

The examples provided in FIGS. 1 and 2 provide examples of absolute FLC and Tcal values. That is, the FLC and Tcal values are compared to a true GNSS millisecond boundary. The use of the absolute values in FIGS. 1 and 2 is provided for the purpose of explaining the relationship between the TOA, range, FLC and Tcal values. As will be described herein, a relative Tcal (dTcal) value may be derived based on the comparison of Time of Arrival (TOA) measurements received from different mobile device model types. Crowdsourcing data received from mobile devices may include TOA measurement data and a user location. In an example, the geographic area around a cellular transceiver may be partitioned into a grid. The TOA measurements may be grouped by geographic areas and mobile device model types. The Tcal values for a particular mobile device model are assumed to be fairly consistent, thus the corresponding TOA measurements for a given mobile device model in a given geographic area will also be fairly consistent. One mobile device model may be selected as a reference model. The criteria for the selection may include the number of data points (i.e., most popular model), the standard deviation of the TOA measurements, average signal strength, or other signal related properties. The mean TOA value for the reference model can be compared to the TOA measurements obtained for the other mobile devices to determine TOA difference values. The TOA difference values as compared to the baseline model type may be collected for multiple geographic areas around the cellular transceiver. Since the TOA measurements are obtained from mobile devices within a known geographic area (i.e., a fixed location), the differences in the TOA values are in large part due to the different Tcal values in the respective mobile devices. Thus, relative Tcal (dTcal) values associated with the reference mobile device model and the other mobile device models may be established and stored in a location almanac (e.g., database). A database of dTcal values can reduce the need to determine an absolute Tcal value in each individual mobile device.

Figure 3:
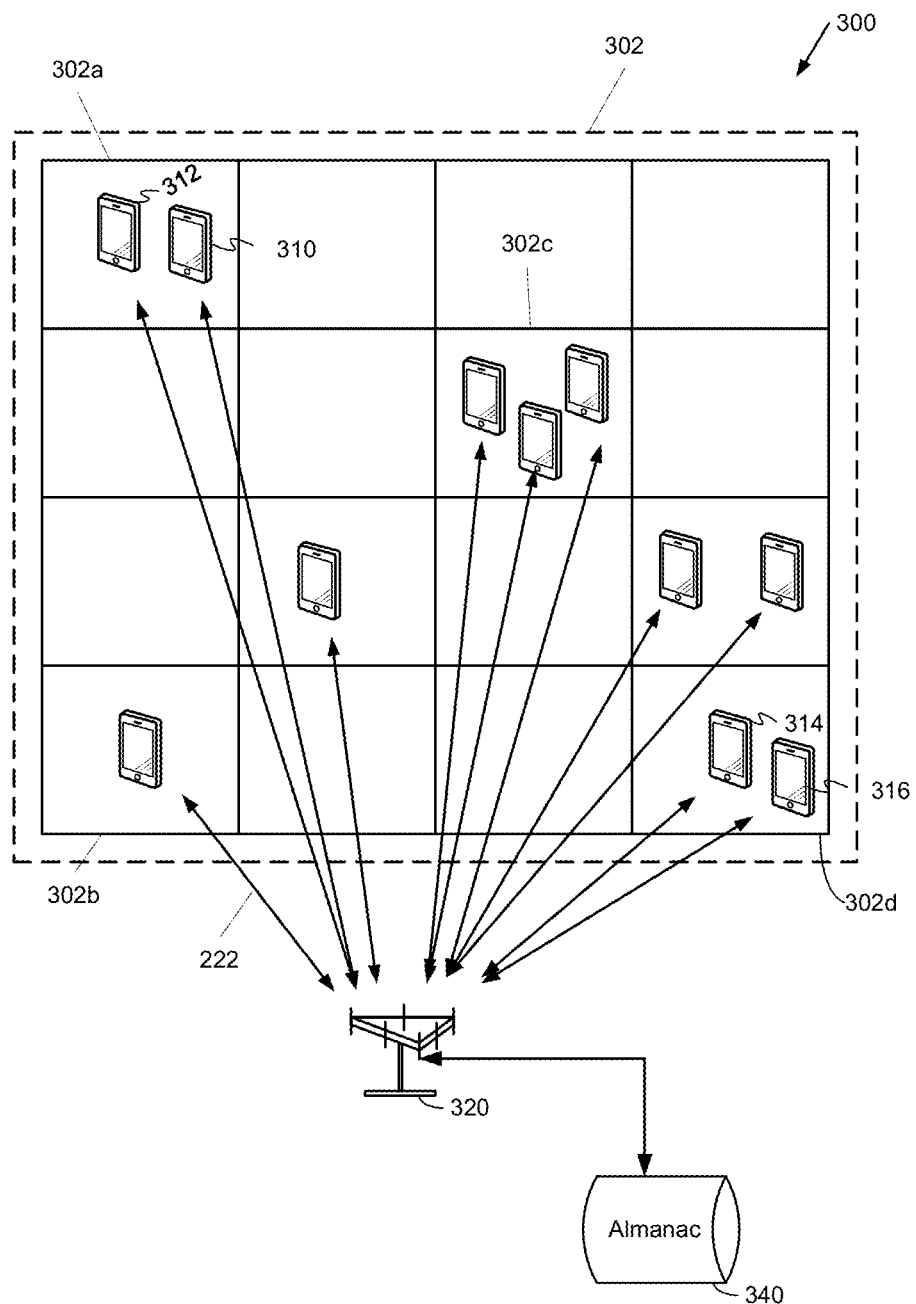
FIG. 3 is an illustration of multiple mobile devices disposed in a geographic grid.

Referring to FIG. 3, an illustration 300 of multiple mobile devices disposed in a geographic grid is shown. The illustration 300 includes a geographic area 302 which includes smaller geographic units at various locations relative to a cellular transceiver 320. In an example, the smaller geographic units may be disposed in a grid pattern such as illustrated in FIG. 3. Each of the geographic units may range in size (e.g., 5 m², 10 m², 100 m²). One or more mobile devices may be disposed in the individual grid units. For example, a first grid unit 302a includes two mobile devices 310, 312, a second grid unit 302b includes one mobile device, a third grid unit 302c includes three mobile devices, and a fourth grid unit 302d includes two mobile devices 314, 316. Each of the mobile devices within the geographic area 302 is configured to communicate with the cellular transceiver 320. The use of the cellular transceiver 320 is exemplary only, and not a limitation, as other wireless communication stations such as a local transceiver may be used. The cellular transceiver 320 may be operably connected to an almanac 340 directly or via a network. The communications between the mobile devices and the cellular transceiver 320 may be via a Line-of-Sight (LOS) communication path, or via other indirect communication paths (e.g., multipath). The disposition of the grid units and the corresponding number and dispositions of the mobile devices within the grid units are exemplary only and not a limitation. The dimensions and shapes of each of grid units 302a, 302b, 302c, 302d may vary based on geographical features, propagation patterns, multipath propagation, the performance of the antenna system associated with the cellular transceiver 320, transmit power, and/or other factors which may impact the dispersion of radio frequency energy. Subdividing the geographic area 302 into the smaller grid units represents the general concept of grouping geographic regions into areas which are small enough to have a fairly consistent relative FLC values, yet large enough to have a statistically relevant number of samples. For example, because FLC values at a position may be affected by multipath, the grid units (and corresponding relative FLC values) may be created based on multiple measurements received from the mobile stations located within a geographic area. Multipath refers to effects caused by the reflection of radio signals by objects. Reflected radio signals are delayed relative to direct or line of sight signals and reach the mobile station receiver later than the direct signal. The delay may result in an error in position determination.

Figure 4A:
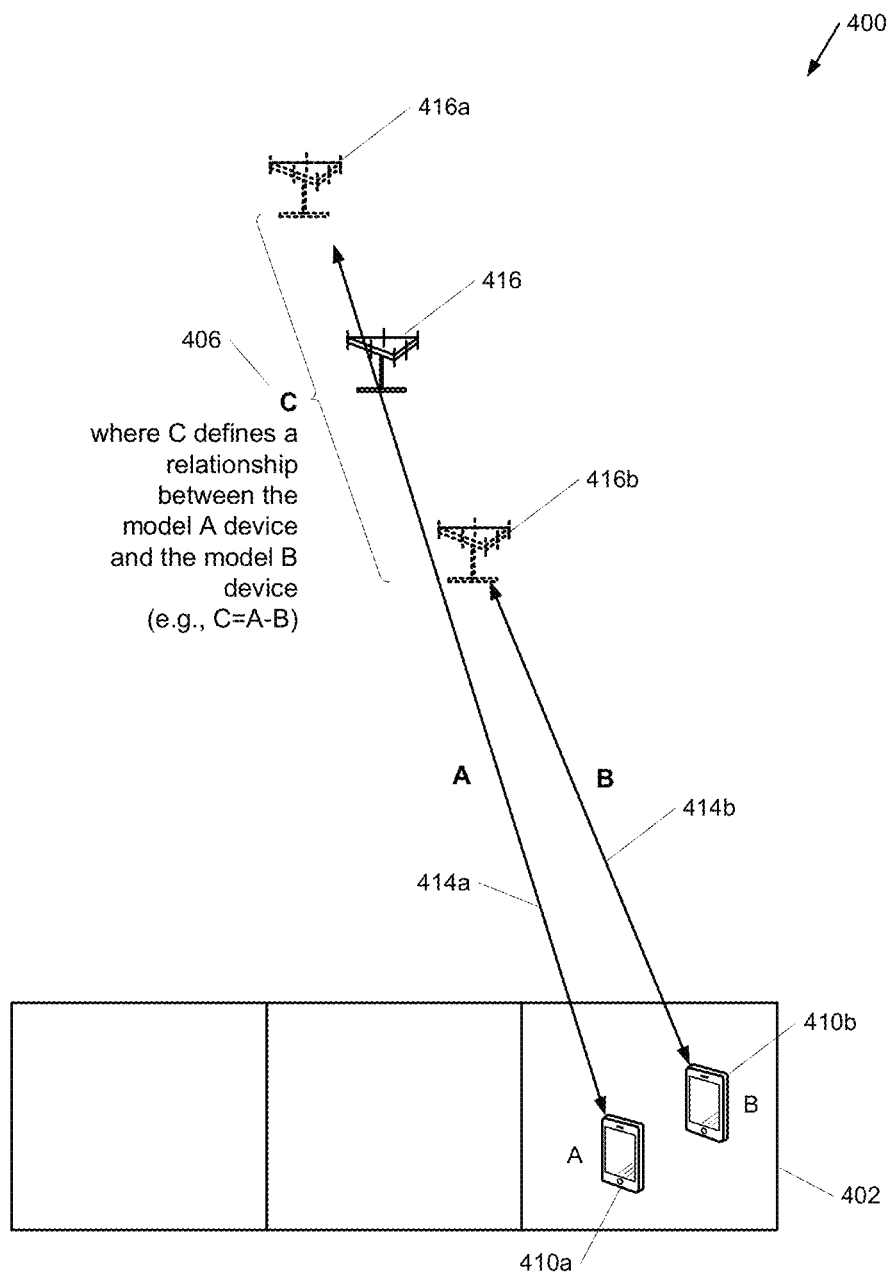
FIG. 4A is an illustration of the impact of Time Calibration (Tcal) for two mobile device models on a reverse position estimate.

Referring to FIG. 4A, with further reference to FIG. 3, an illustration 400 of the impact of Time Calibration (Tcal) for two mobile device models types is shown. The illustration 400 includes two mobile devices 410a, 410b in geographic area 402. The mobile devices 410a, 410b represent different mobile device model types (e.g., Apple iPhone® vers. 4/5/6, Samsung Galaxy®, HTC One®, etc. . . . ), generally designated as model 'A' and model 'B' to simplify the example. The different mobile device model types typically will have different Tcal values. The two mobile device model types depicted in FIG. 4A is a generalization of the crowdsourcing concepts described herein. The crowdsourcing data may include TOA measurement and user location information. No prior knowledge of the mobile device Tcal value, base station location, and FLC values is required. Each of the mobile devices 410a, 410b is in communication with a cellular transceiver 416 (e.g., via a communication link 622). The position of the cellular transceiver 416 may be determined in part via reverse positioning based on the location of the mobile devices 410a, 410b and the respective signal exchanges 414a, 414b. Time of Arrival (TOA) information may be determined based on each of the signal exchanges 414a, 414b. Since each of the mobile devices 410a, 410b are different models, the respective TOA measurements are different due to variations in hardware and software elements in the mobile devices. These differences may be compensated for using Tcal values. Due to the different Tcal values, the reverse position of the cellular transceiver 416 may vary based on the TOA differences. For example, a first cellular transceiver position 416*a* may be based in part on the first signal exchange 414*a*, and a second cellular transceiver position 416*b* may be based in part on a second signal exchange 414*b* between the respective mobile devices 410*a*, 410*b*. The TOA measurements 'A' and 'B' are compared to determine the relative Tcal value between the two different mobile device models 410*a*, 410*b*. As depicted in FIG. 4A, TOA measurement 'A' is greater than TOA measurement 'B' by a value of 'C' 406. Since the measurements are derived from mobile stations within a known geographic area 402, propagation effects and the corresponding FLC values should be substantially similar same for both devices. Thus, the value of 'C' 406 represents the relative impact of the different Tcal values within the two different mobile device models 410*a*, 410*b*. The value 'C' 406 illustrates the impact of the relative Tcal (dTcal) between model A and model B devices. While FIG. 4A only discloses two different mobile devices, in operation the TOA measurements, the location of the cellular transceiver 416, and the corresponding relationships (e.g., 'C' values) between different models may be established with much larger (e.g., statistically relevant) datasets. The value of 'B' represents the mean of the TOA measurements from a reference device, and the value 'C' represents the TOA difference for the model 'A' device in the geographic area 402. The average TOA difference (e.g., 'C' values) across multiple geographic areas for a given mobile device model type is the dTcal value for that model type as compared to the baseline model type. A reverse position of the cellular transceiver 416 may be determined based on the dTcal values across each grid area and for each mobile device model type. The estimated position of the cellular transceiver 416 and the resulting FLC is the relative FLC (i.e., relative to the reference mobile device model type).

The geographic area 402, the mobile device model information, the TOA measurements, FLC information, dTcal values, and the associated cellular transceiver position information may be stored in the almanac 340. Additional data may be obtained from multiple mobile devices, including multiple mobile device models, such that a matrix of relationships (e.g., dTcal values) may be determined amongst each of the different device models. A relative FLC may be realized by selecting one mobile device model as a baseline model, determining the mean of the TOA measurements received from the baseline model in a geographic unit, subtracting the baseline mean from the TOA measurements obtained from other mobile devices in that geographic unit, collecting these differences across multiple geographic units (e.g., each of the geographic units in the geographic area 302) and finding the average difference for each model. That is, each of the other mobile device models may have dTcal values (e.g., 'C' values) that are associated with the comparison to the baseline model. The average and std difference as compared to the baseline model may be determined for each device model across the coverage area of the cellular transceiver 320 (e.g., multiple geographic units). Thus, the dTcal for a given device model may be expressed as the average difference (avgDifference) and a dTcal Uncertainty value (dTcalUnc) may be expressed the standard deviation of the differences (stdDifference) per device model.

Figure 4B:
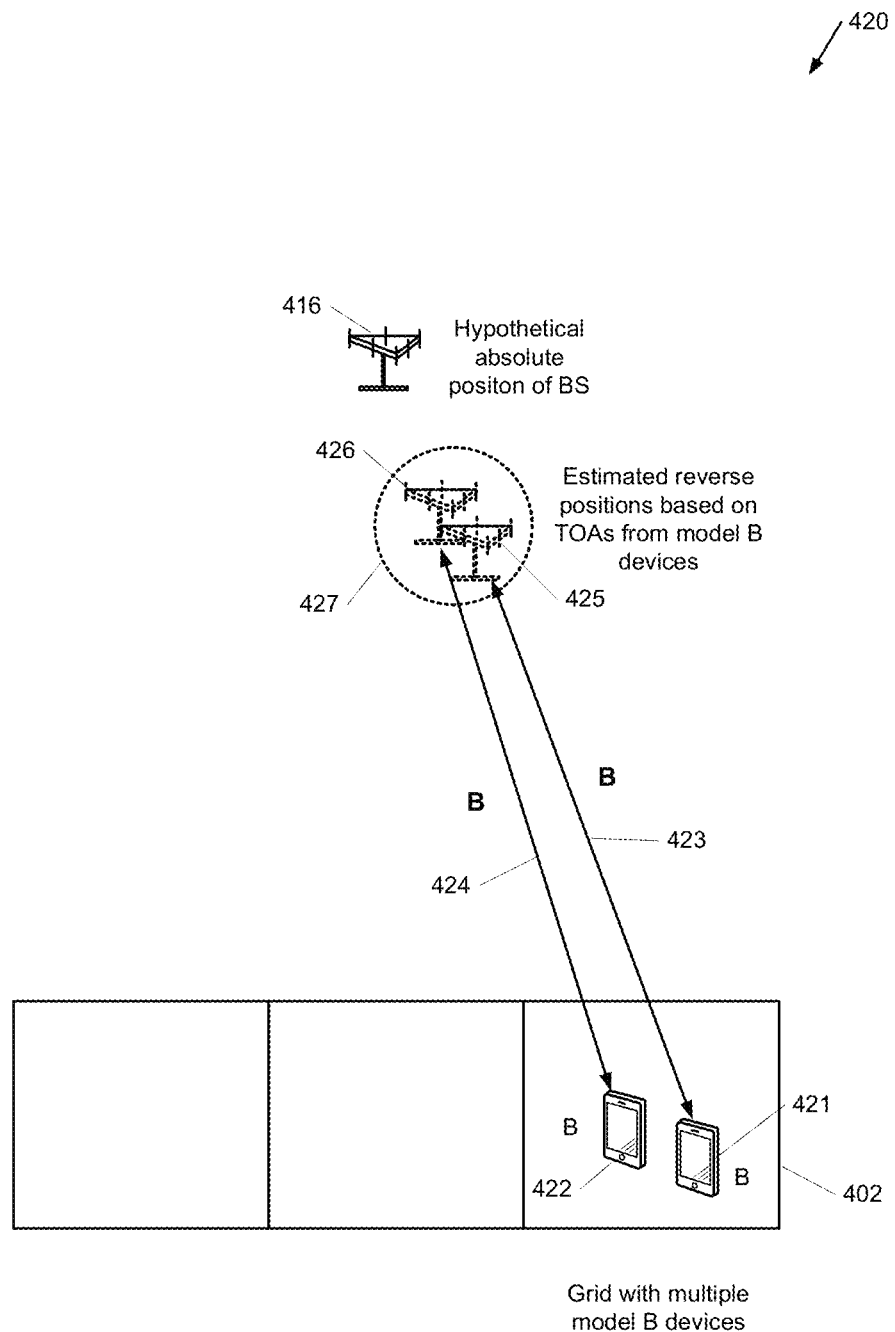
FIG. 4B is an illustration of an estimated reverse position of a base station using the same mobile device model.

Referring to FIG. 4B, with further reference to FIG. 4A, an illustration 420 of an estimated reverse position of a base station using two of the same mobile device model is shown. The illustration 420 includes two mobile devices 421, 422 in the geographic area 402 that are in communication with a cellular transceiver 416. In this example, the two mobile devices 421, 422 are the same mobile device model (e.g., model 'B') and thus have similar TCal values. An estimated reverse position 427 and FLC value (including uncertainty values) may be based on aggregating the results of multiple reverse positioning events with one or more mobile devices in multiple geographic areas. For example, a first estimated position 425 of the cellular transceiver 416 is based in part on a first TOA measurement exchange 423 with the first mobile device 421, and a second estimated position 426 of the cellular transceiver 416 is based in part on a second TOA measurement exchange 424 with the second mobile device 422. The estimated reverse position 427 is the aggregation the individual reverse position estimates calculated from multiple mobile devices of the same model type, across multiple geographic areas. While only two mobile devices 421, 422 are shown in a single geographic area 402, the estimated reverse position 427 may be based on lines of position from other geographic areas. The estimated reverse position 427 and the associated uncertainty value may be stored in the almanac 340 as the baseline position of the cellular transceiver 416 for an FLC group. In this example, the FLC group is associated with the model type 'B' mobile devices and may be used in subsequent forward positioning operations.

In an example, the baseline position of the cellular transceiver 416 may also be calculated using TOA measurements from other mobile device model types (e.g., other than model type 'B'), providing the other mobile device model types have dTcal values related to the baseline model device type. In this case, the TOA measurements are compensated with the dTcal values derived from the comparison to the TOA measurements corresponding to model type 'B' (i.e., the baseline model type). Multilateration algorithms may be used on the compensated TOA measurements to derive the location of cellular transceiver.

Figure 4C:
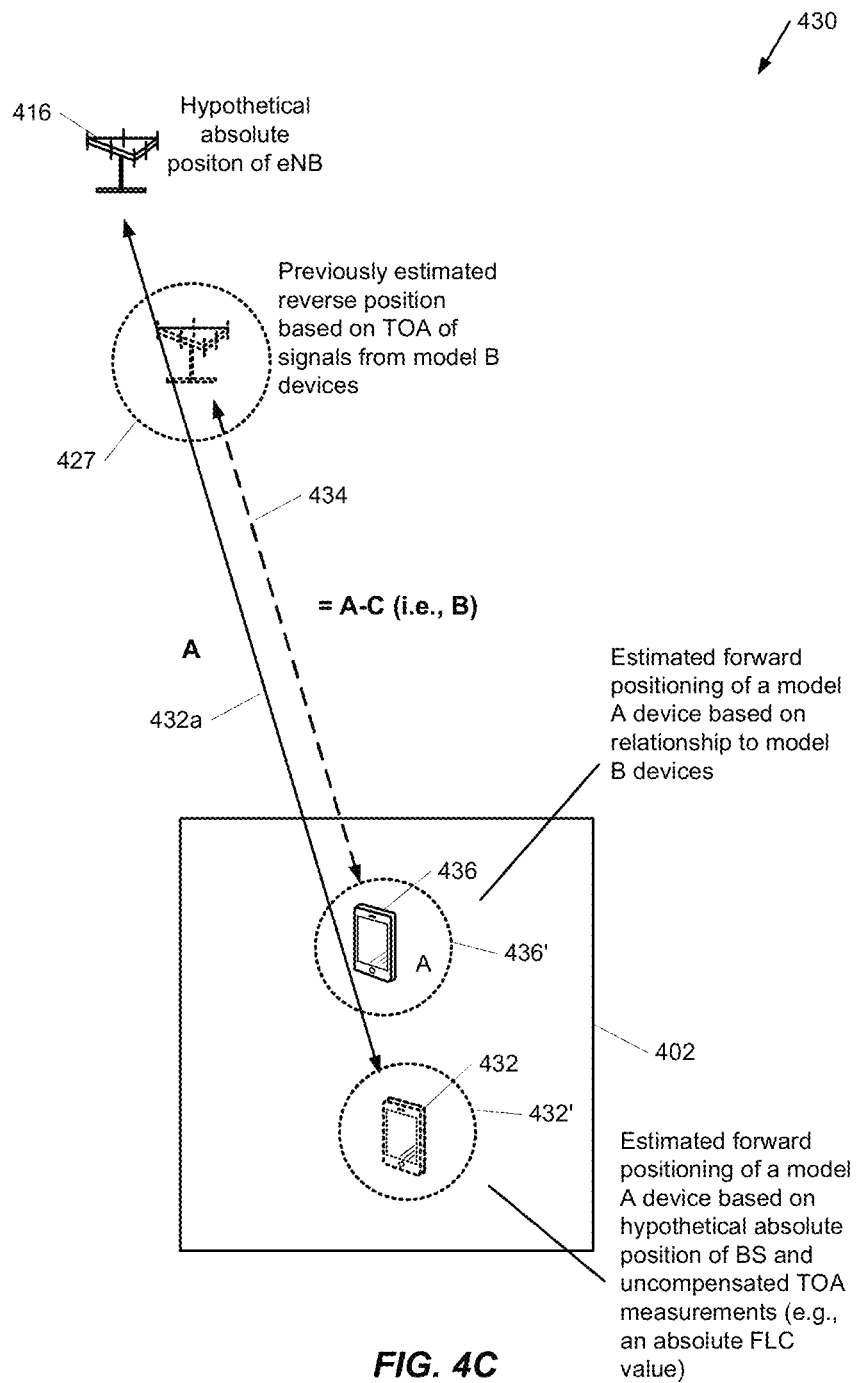
FIG. 4C is an illustration of an estimated forward position based on a relative FLC value.

Referring to FIG. 4C, with further reference to FIGS. 4A and 4B, an illustration 430 of an estimated forward position based on a relative FLC value is shown. The illustration 420 includes the cellular transceiver 416 and a mobile device 436. For the purposes of this example, the mobile device 436 is a type 'A' mobile device as described in FIG. 4A. The mobile device 436 is located within a first uncertainty area 436'. For the sake of explanation, a second position 432 and a second uncertainty area 432' for the mobile device 436 are also shown on FIG. 4A. The second position 432 indicates the estimated position of the mobile device if an absolute FLC value is used in conjunction with TOA information derived from messages between the mobile device 436 and the cellular transceiver 416. The cellular transceiver 416 is operationally connected to a base station almanac (e.g., almanac 340) and is configured to provide assistance data to the mobile device 436. In an example, the cellular transceiver 416 may be an eNB. The assistance data may include a relative FLC value associated with the geographic area 402, an FLC type indicator to identify whether the FLC value is relative or absolute, and a FLC group index if the FLC type is relative. The FLC type indicator may be a data field or other data structure used to inform the mobile device that FLC value in the assistance data is relative or absolute. If the FLC value is relative, the FLC type indicator may be used to prevent the mobile device from attempting a fine time transfer with the relative FLC value. For a relative FLC, the FLC group index may link the cellular transceiver 416 (e.g, an eNB) to relative FLC groups (e.g., group of transceivers with a relative FLC based on the same reference mobile device model) and enable forward positioning based on the specific FLC group.

In operation, the use of a relative FLC value may provide a more accurate position estimate as compared to using an absolute FLC value. A connection 432a may be established between the mobile device 436 and the cellular transceiver 416. The connection 432a may be a communication link 622 and configured to support the transfer of assistance data from a network to the mobile device 436, and the transfer of location information (e.g., TOA measurements) from the mobile device 436 to the network. The connection 432a may be described as LTE Positioning Protocol (LPP) or LPP Extensions (LPPe) protocol messages, but other connections and communication protocols may be used. The connection 432a may be used to determine a TOA measurement between the cellular transceiver 416 and the mobile device. The mobile device 436 may provide an a priori location and device model type information to the location server 640 via the cellular transceiver 416. The location server 640 is configured to access a previously stored database to determine a relative FLC value based on the a priori position of the mobile device and the mobile device model type. The cellular transceiver 416 may then provide a relative FLC value and an estimated reverse position 427 of the cellular transceiver to the mobile device. The relative FLC value is based on the relationship between mobile device models (e.g., model 'A' and model 'B') as described in FIG. 4A. For example, the dTcal value associated with the respective mobile device models (e.g., the value 'C'). The dTcal value is used to determine a compensated TOA 434. The server 640 is configured to determine a compensated TOA value (compTOA) and a compensated TOA uncertainty value (compTOAUnc) with the appropriate dTcal value.

$$\text{compTOA}(i,\text{ref})=\text{TOA}(i)-d\text{Tcal}(i,\text{ref})$$

$$\text{compTOAUnc}(i,\text{ref})=\text{sqrt}(\text{TOAUnc}(i)^2+\text{TcalUnc}(i,\text{ref})^2)$$

where i is the measuring device and ref is the baseline device model.

For example, the compensated TOA 434 may be determined by applying the dTcal value (e.g., subtracting the value 'C') to the measured TOA value (e.g., the value 'A'). The model 'A' mobile device 436 may utilize the estimated reverse position 427 of the cellular transceiver and the relative FLC (i.e., compensated TOA 434) in positioning algorithms to determine an estimated position of the mobile device 436 and the first uncertainty area 436'. For example, when a mobile device is communicating with multiple cellular transceivers, the mobile device may collect TOA measurements from the cellular transceivers. The TOA measurements may be sorted per FLC groups and the number of TOA's per FLC group. The TOA measurements may be compensated with the relative FLC values per FLC group. If a sufficient number of TOA measurements are available within a FLC group (e.g., 3 TOA measurements), a position estimate may be generated (e.g., such as with trilateration methods). Two or more sets of TOA measurements from different FLC groups may be used if a sufficient number of TOA measures from a single group are not available.

Figure 4D:
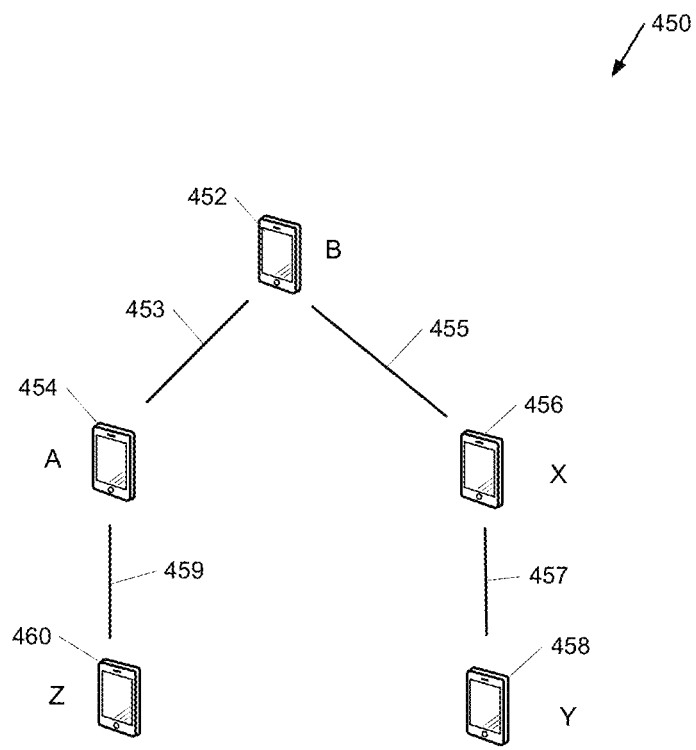
FIG. 4D is a conceptual diagram of stitching relative Tcal (dTcal) values based on one or more relationships between mobile device models.

Referring to FIG. 4D, a conceptual diagram 450 of stitching dTcal values based on one or more relationships between mobile device models is shown. The conceptual diagram includes five different mobile device model types (e.g., type 'B' 452, type 'A' 454, type 'X' 456, type 'Y' 458, and type 'Z' 460) and the corresponding relationships between the devices (e.g., AB 453, BX 455, XY 457, and AZ 459). Each of the different mobile device model types may have different Tcal values and the relationships represent the corresponding dTcal values. In this example, the type 'B' model 452 is the baseline model type. The baseline may represent the most popular mobile device model on a network or within a geographic area (e.g., based on unit counts), and/or the mobile device model with the highest number of positioning records (e.g., TOA data) in a geographic area. Other signal parameters, such as deviation to TOA measurements, average signal strength, channel utilization, bandwidth, and frequency may be used in determining a baseline model type. As an example, the relationship AB 453 is as described in FIGS. 4A-4C including an estimated reverse position 427 of the cellular transceiver and a relative FLC value based on the compensated TOA 434. The approach described in FIGS. 4A-4C may be applied to the relationship BX 455 based on the comparison of measurement data obtained from type 'B' 452 mobile devices and the type 'X' 456 mobile devices. The approach may be repeated for different pairs of mobile device types in a network or geographic area. For example, the relationship AZ 459 indicates a relative FLC value between type 'A' mobile devices and type 'Z' mobile devices. Similarly, the relationship XY indicates a relative FLC value between type 'X' 456 mobile devices and type 'Y' 458 mobile devices. The approach may be extended over several different mobile device model types and geographic areas to determine relative Tcal (i.e., dTcal) values between different model types. Further, the dTcal values from previously unrelated (i.e., without relationship data between the model types) may be stitched to create relationships between the previously unrelated model types. For example:

$$d\text{Tcal}(i,\text{ref})=\text{mean}(d\text{Tcal}(i,j)+d\text{Tcal}(j,\text{ref}))$$

where j refers to any device model that connects measurements from this device type to the reference device type, and an uncertainty value is determined by:

$$\text{TcalUnc}(i,\text{ref})=\text{sqrt}(\text{mean}(\text{TcalUnc}(i,j)^2+\text{TcalUnc}(j,\text{ref})^2)).$$

In an example, a relationship between model type 'Z' 460 and model type 'B' 452 may be determined by stitching through model type 'A' 454 such that $$d\text{Tcal}(Z,B)=\text{mean}(d\text{Tcal}(Z,A)+d\text{Tcal}(A,B))$$

$$\text{TcalUnc}(Z,B)=\text{sqrt}(\text{mean}(\text{TcalUnc}(Z,A)^2+\text{TcalUnc}(A,B)^2))$$

The example may be extended to any of the other model device types in FIG. 4D. Stitching the dTcal values for different device model types is particularly relevant when no dominant (i.e., baseline) model is identified in a network or geographic area. Further, in that the dTcal values are associated with device model types, the dTcal values may be provided to other networks and/or geographic areas where the device models are used. For example, a device model type may be popular in a particular market and therefore the dTcal values may be determined from a large dataset. These values may be used in another market where the particular device model is less popular, or there are just fewer mobile stations overall. In either case, the dTcal values from the first market may be used to be used to improve the accuracy of positioning in the second market.

Figure 5A:
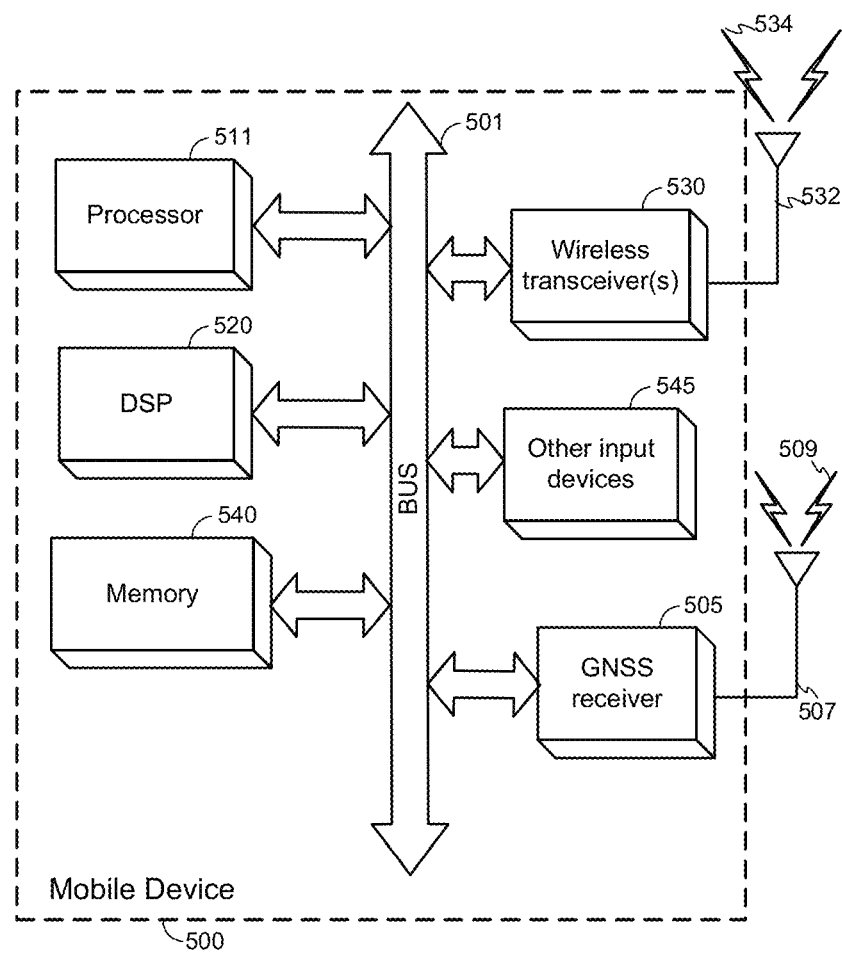
FIG. 5A is a block diagram of a mobile device that can be used to implement the techniques discussed herein.

Referring to FIG. 5A, a block diagram of a mobile device 500 that can be used to implement relative forward link calibration estimation is show. The mobile device 500 can include or implement the functionality of various mobile communication and/or computing devices; examples include, but are not limited to, tablets, smartphones, portable navigation devices, network enabled wrist watches, etc., whether presently existing or developed in the future. The mobile device 500 includes a processor 511 (or processor core), one or Digital Signal Processors (DSP) 520, and memory unit 540. The mobile device 500 may also include a wireless transceiver 530 configured to send and receive wireless signals 534 via a wireless antenna 532 over a wireless network. The wireless transceiver 530 is connected to a bus 501. Here, the mobile device 500 is illustrated as having a single wireless transceiver 530. However, a mobile device 500 can alternatively have multiple wireless transceivers 530 and wireless antennas 532 to support multiple communication standards such as Wi-Fi, CDMA, Wideband CDMA (WCDMA), Long Term Evolution (LTE), Bluetooth short-range wireless communication technology, etc.

The wireless transceiver 530 may support operation on multiple carriers (waveform signals of different frequencies). Multi-carrier transmitters can transmit modulated signals simultaneously on the multiple carriers. Each modulated signal may be a Code Division Multiple Access (CDMA) signal, a Time Division Multiple Access (TDMA) signal, an Orthogonal Frequency Division Multiple Access (OFDMA) signal, a Single-Carrier Frequency Division Multiple Access (SC-FDMA) signal, etc. Each modulated signal may be sent on a different carrier and may carry pilot, overhead information, data, etc.

The mobile device 500 also includes a Global Navigation Satellite System (GNSS) receiver 505 that receives satellite positioning system (SPS) signals 509 (e.g., from SPS satellites) via an SPS antenna 507. The GNSS receiver 505 can communicate with a single global navigation satellite system (GNSS) or multiple such systems. A GNSS can include, but are not limited to, Global Positioning System (GPS), Galileo, Glonass, Beidou (Compass), etc. SPS satellites are also referred to as satellites, space vehicles (SVs), etc. The GNSS receiver 505 processes, in whole or in part, the SPS signals 509 and uses these SPS signals 509 to determine the location of the mobile device 500. The processor 511, DSP 520, and memory 540, and/or specialized processor(s) (not shown) may also be utilized to process the SPS signals 509, in whole or in part, and/or to calculate the location of the mobile device 500, in conjunction with GNSS receiver 505. Storage of information from the SPS signals 509 or other location signals is performed using a memory unit 540 or registers (not shown). While only one processor 511, DSP 520, and a memory unit 540 are shown in FIG. 5A, more than one of any, a pair, or all of these components could be used by the mobile device 500.

The memory unit 540 can include a non-transitory computer-readable storage medium (or media) that stores functions as one or more instructions or code. Media that can make up the memory unit 540 include, but are not limited to, RAM, ROM, FLASH, disc drives, etc. In general, the functions stored by the memory unit 540 are executed by the processor 511, DSP 520, or other specialized processors. Thus, the memory unit 540 is a processor-readable memory and/or a computer-readable memory that stores software (programming code, instructions, etc.) configured to cause the processor 511 to perform the functions described. Alternatively, one or more functions of the mobile device 500 may be performed in whole or in part in hardware.

A mobile device 500 can estimate its current position within an associated system using various techniques, based on other communication entities within view and/or information available to the mobile device 500. For instance, a mobile device 500 can estimate its position using information obtained from access points (APs) associated with one or more wireless local area networks (LANs), personal area networks (PANs) utilizing a short-range wireless communication technology such as Bluetooth or ZigBee®, etc., SPS satellites, inertial navigation sensors (e.g., accelerometers, gyroscopes, magnetometer), and/or map constraint data obtained from a map server or LCI server. One or more of these techniques may be used to determine an a priori position of the mobile device.

The mobile device includes one or more other input devices 545 such as a touch display, microphone, camera, accelerometers, solid state compass, pressure sensor, magnetometer, gyroscope, and other tactile devices (e.g., buttons, knobs) configured to receive kinetic, electrical and/or magnetic input.

Figure 5B:
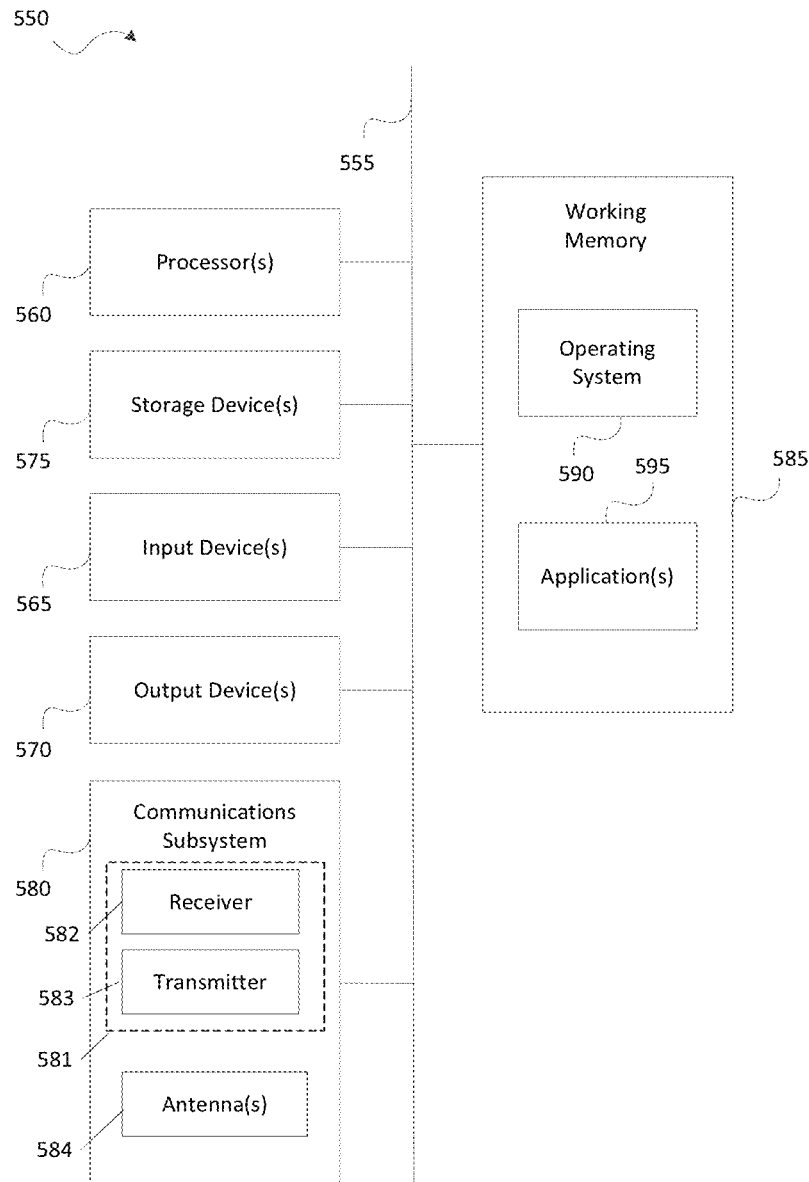
FIG. 5B is a block diagram of a server that can be used to implement the techniques discussed herein.

Referring to FIG. 5B, a computer system 550 to implement relative forward link calibration estimation is shown. FIG. 5B provides a schematic illustration of one embodiment of a computer system 550 that can perform the methods provided by various other embodiments, as described herein, and/or can function as a mobile device or other computer system. FIG. 5B provides a generalized illustration of various components, any or all of which may be utilized as appropriate. FIG. 5B therefore, broadly illustrates how individual system elements may be implemented in a relatively separated or relatively more integrated manner.

The computer system 550 is shown comprising hardware elements that can be electrically coupled via a bus 555 (or may otherwise be in communication, as appropriate). The hardware elements may include one or more processors 560, including without limitation one or more general-purpose processors and/or one or more special-purpose processors (such as digital signal processing chips, graphics acceleration processors, and/or the like); one or more input devices 565, which can include without limitation a mouse, a keyboard and/or the like; and one or more output devices 570, which can include without limitation a display device, a printer and/or the like. The processor(s) 560 can include, for example, intelligent hardware devices, e.g., a central processing unit (CPU) such as those made by Intel® Corporation or AMD®, a microcontroller, an ASIC, etc. Other processor types could also be utilized.

The computer system 550 may further include (and/or be in communication with) one or more non-transitory storage devices 575, which can comprise, without limitation, local and/or network accessible storage, and/or can include, without limitation, a disk drive, a drive array, an optical storage device, solid-state storage device such as a random access memory ("RAM") and/or a read-only memory ("ROM"), which can be programmable, flash-updateable and/or the like. Such storage devices may be configured to implement any appropriate data stores, including without limitation, various file systems, database structures, and/or the like.

The computer system 550 might also include a communications subsystem 580, which can include without limitation a modem, a network card (wireless or wired), an infrared communication device, a wireless communication device and/or chipset (such as a BLUETOOTH short-range wireless communication technology transceiver/device, an 802.11 device, a WLAN device, a WiMax device, cellular communication facilities, etc.), and/or the like. The communications subsystem 580 may permit data to be exchanged with a network (such as the network described below, to name one example), other computer systems, and/or any other devices described herein. The communications subsystem 580 may include a receiver 582, a transmitter 583, and one or more antennas 584. The transmitter 583, the antennas 584, and the receiver 582 form a wireless communication module (with the transmitter 583 and the receiver 582 being a transceiver 581). In many embodiments, the computer system 550 will further comprise, as here, a working memory 585, which can include a RAM or ROM device, as described above.

The computer system 550 also can comprise software elements, shown as being currently located within the working memory 585, including an operating system 590, device drivers, executable libraries, and/or other code, such as one or more application programs 595, which may comprise computer programs provided by various embodiments, and/or may be designed to implement methods, and/or configure systems, provided by other embodiments, as described herein. Merely by way of example, one or more processes described herein might be implemented as code and/or instructions executable by a computer (and/or a processor within a computer). Such code and/or instructions can be used to configure and/or adapt a general purpose computer (or other device) to perform one or more operations in accordance with the described methods.

A set of these instructions and/or code might be stored on a non-transitory computer-readable storage medium, such as the storage device(s) 575 described above. In some cases, the storage medium might be incorporated within a computer system, such as the computer system 550. In other embodiments, the storage medium might be separate from a computer system (e.g., a removable medium, such as a compact disc), and/or provided in an installation package, such that the storage medium can be used to program, configure and/or adapt a general purpose computer with the instructions/code stored thereon. These instructions might take the form of executable code, which is executable by the computer system 550 and/or might take the form of source and/or installable code, which, upon compilation and/or installation on the computer system 550 (e.g., using any of a variety of generally available compilers, installation programs, compression/decompression utilities, etc.) then takes the form of executable code.

Substantial variations may be made in accordance with specific desires. For example, customized hardware might also be used, and/or particular elements might be implemented in hardware, software (including portable software, such as applets, etc.), or both. Further, connection to other computing devices such as network input/output devices may be employed.

The computer system 550 may be used to perform methods in accordance with the disclosure. Some or all of the procedures of such methods may be performed by the computer system 550 in response to processor 560 executing one or more sequences of one or more instructions (which might be incorporated into the operating system 590 and/or other code, such as application programs 595) contained in the working memory 585. Such instructions may be read into the working memory 585 from another computer-readable medium, such as one or more of the storage device(s) 575. Merely by way of example, execution of the sequences of instructions contained in the working memory 585 might cause the processor(s) 560 to perform one or more procedures of the methods described herein.

The terms "machine-readable medium" and "computer-readable medium," as used herein, refer to any medium that participates in providing data that causes a machine to operate in a specific fashion. In an embodiment implemented using the mobile device 500 and/or the computer system 550, various computer-readable media might be involved in providing instructions/code to processor(s) 511, 560 for execution and/or might be used to store and/or carry such instructions/code (e.g., as signals). In many implementations, a computer-readable medium is a physical and/or tangible storage medium. Such a medium may take many forms, including but not limited to, non-volatile media, volatile media, and transmission media. Non-volatile media include, for example, optical and/or magnetic disks, such as the memory 540 and storage device(s) 575. Volatile media include, without limitation, dynamic memory, such as the working memory 585. Transmission media include, without limitation, coaxial cables, copper wire and fiber optics, including the wires that comprise the bus 501, 555, as well as the various components of the communications subsystem 580 (and/or the media by which the communications subsystem 580 provides communication with other devices).

Common forms of physical and/or tangible computer-readable media include, for example, a floppy disk, a flexible disk, hard disk, magnetic tape, or any other magnetic medium, a CD-ROM, a Blu-Ray disc, any other optical medium, punch cards, paper tape, any other physical medium with patterns of holes, a RAM, a PROM, EPROM, a FLASH-EPROM, any other memory chip or cartridge, a carrier wave as described hereinafter, or any other medium from which a computer can read instructions and/or code.

Various forms of non-transitory computer-readable media may be involved in carrying one or more sequences of one or more instructions to the processor(s) 511, 560 for execution. Merely by way of example, the instructions may initially be carried on a magnetic disk and/or optical disc of a remote computer. A remote computer might load the instructions into its dynamic memory and send the instructions as signals over a transmission medium to be received and/or executed by the mobile device 500 and/or computer system 550. These signals, which might be in the form of electromagnetic signals, acoustic signals, optical signals and/or the like, are all examples of carrier waves on which instructions can be encoded, in accordance with various embodiments of the invention.

Figure 6:
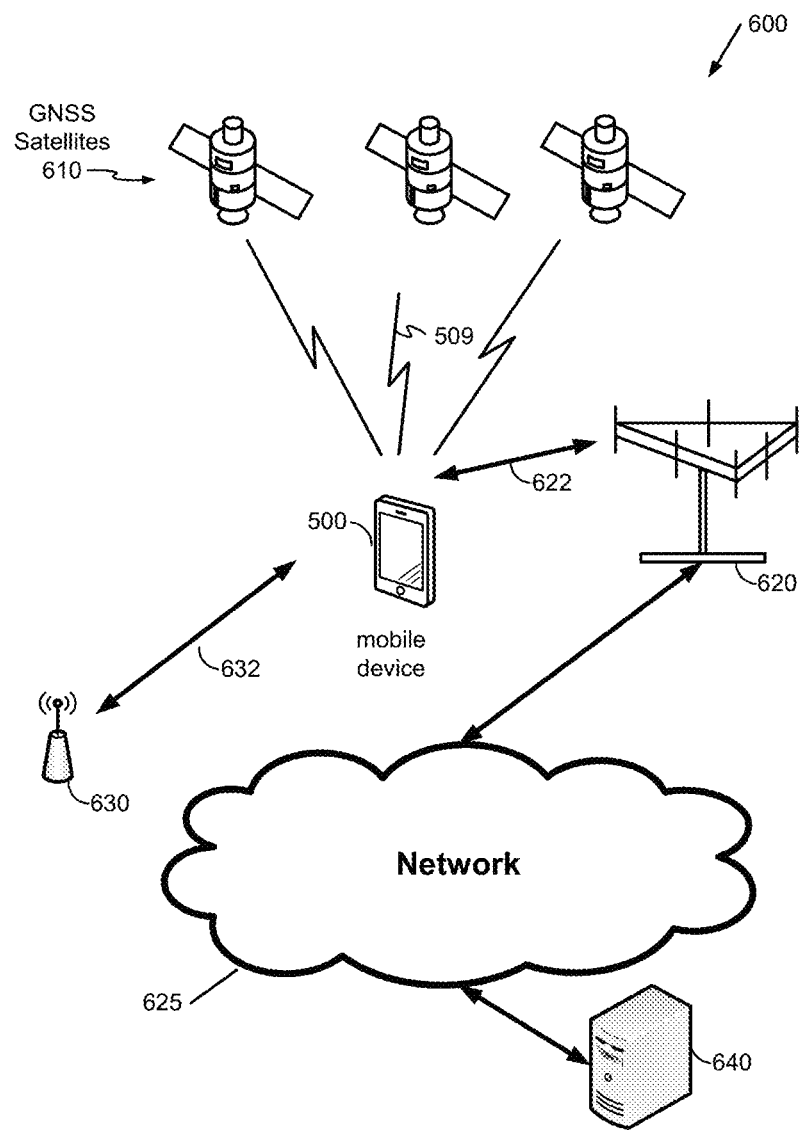
FIG. 6 is a block diagram of an example network architecture configured to communicate with the mobile device of FIG. 5A

Referring to FIG. 6, an example network architecture 600 configured to communicate with the mobile device 500 of FIG. 5A and the computer system 550 of FIG. 5B is shown. The mobile device 500, may transmit radio signals to, and receive radio signals from, a wireless communication network. In one example, mobile device 500 may communicate with a cellular communication network by transmitting wireless signals to, or receiving wireless signals from a cellular transceiver 620 which may comprise a wireless base transceiver subsystem (BTS), a Node B or an evolved NodeB (eNB) over wireless communication link 622. Similarly, mobile device 500 may transmit wireless signals to, or receive wireless signals from local transceiver 630 over wireless communication link 632. A local transceiver 630 may comprise an access point (AP), femtocell, Home Base Station, small cell base station, Home Node B (HNB) or Home eNodeB (HeNB) and may provide access to a wireless local area network (WLAN, e.g., IEEE 802.11 network), a wireless personal area network (WPAN, e.g., Bluetooth® network) or a cellular network (e.g. an LTE network or other wireless wide area network such as those discussed in the next paragraph). Of course it should be understood that these are merely examples of networks that may communicate with a mobile device over a wireless link, and claimed subject matter is not limited in this respect.

Examples of network technologies that may support wireless communication link 622 are Global System for Mobile Communications (GSM), Code Division Multiple Access (CDMA), Wideband CDMA (WCDMA), Long Term Evolution LTE), High Rate Packet Data (HRPD). GSM, WCDMA and LTE are technologies defined by 3GPP. CDMA and HRPD are technologies defined by the 3rd Generation Partnership Project 2 (3GPP2). WCDMA is also part of the Universal Mobile Telecommunications System (UMTS) and may be supported by an HNB. Cellular transceivers 620 may comprise deployments of equipment providing subscriber access to a wireless telecommunication network for a service (e.g., under a service contract). Here, a cellular transceiver 620 may perform functions of a cellular base station in servicing subscriber devices within a cell determined based, at least in part, on a range at which the cellular transceiver 620 is capable of providing access service. Examples of radio technologies that may support wireless communication link 622 are IEEE 802.11, Bluetooth (BT) and LTE.

In a particular implementation, cellular transceiver 620 and local transceiver 630 may communicate with one or more servers 640 (e.g., computer system 550) over a network 625. Here, the network 625 may comprise any combination of wired or wireless links and may include cellular transceiver 620 and/or local transceiver 630 and/or servers 640. The server 640 is a computer system 550. In a particular implementation, network 625 may comprise Internet Protocol (IP) or other infrastructure capable of facilitating communication between mobile device 500 and servers 640 through local transceiver 630 or cellular transceiver 620. In an implementation, network 625 may comprise cellular communication network infrastructure such as, for example, a base station controller or packet based or circuit based switching center (not shown) to facilitate mobile cellular communication with mobile device 500. In a particular implementation, network 625 may comprise local area network (LAN) elements such as WLAN APs, routers and bridges and may in that case include or have links to gateway elements that provide access to wide area networks such as the Internet. In other implementations, network 625 may comprise a LAN and may or may not have access to a wide area network but may not provide any such access (if supported) to mobile device 500. In some implementations the network 625 may comprise multiple networks (e.g., one or more wireless networks and/or the Internet). In one implementation, network 625 may include one or more serving gateways or Packet Data Network gateways. In addition, one or more of servers 640 may be an E-SMLC, a Secure User Plane Location (SUPL) Location Platform (SLP), a SUPL Location Center (SLC), a SUPL Positioning Center (SPC), a Position Determining Entity (PDE) and/or a gateway mobile location center (GMLC), each of which may connect to one or more location retrieval functions (LRFs) and/or mobility management entities (MMEs) in network 625.

In particular implementations, and as discussed below, mobile device 500 may have circuitry and processing resources capable of obtaining location related measurements (e.g. for signals received from GNSS or other Satellite Positioning System (SPS) satellites 610, cellular transceiver 620 or local transceiver 630) and computing a position fix or estimated location (e.g., an a priori location) of mobile device 500 based on these location related measurements. In some implementations, location related measurements obtained by mobile device 500 may be transferred to a location server such as an enhanced serving mobile location center (E-SMLC) or SUPL location platform (SLP) (e.g. which may be one of the one or more servers 640) after which the location server may estimate or determine a location for mobile device 500 based on the measurements. In the presently illustrated example, location related measurements obtained by mobile device 500 may include measurements of SPS signals 509 received from satellites belonging to an SPS or Global Navigation Satellite System (GNSS) such as GPS, GLONASS, Galileo or Beidou and/or may include measurements of signals (such as 622 and/or 632) received from terrestrial transmitters fixed at known locations (e.g., such as cellular transceiver 620). Mobile device 500 or a separate location server may then obtain a location estimate for mobile device 500 based on these location related measurements using any one of several position methods such as, for example, GNSS, Assisted GNSS (A-GNSS), Advanced Forward Link Trilateration (AFLT), Observed Time Difference Of Arrival (OTDOA) or Enhanced Cell ID (E-CID) or combinations thereof. In some of these techniques (e.g. A-GNSS, AFLT and OTDOA), pseudoranges or timing differences may be measured at mobile device 500 relative to three or more terrestrial transmitters fixed at known locations or relative to four or more satellites with accurately known orbital data, or combinations thereof, based at least in part, on pilots, positioning reference signals (PRS) or other positioning related signals transmitted by the transmitters or satellites and received at mobile device 500. Doppler measurements may be made to various signal sources such as the cellular transceiver 620, the local transceiver 630, and GNSS satellites 610, and various combination therein. The one or more servers 640 may be capable of providing positioning assistance data to mobile device 500 including, for example, information regarding signals to be measured (e.g., signal timing), locations and identities of terrestrial transmitters and/or signal, timing and orbital information for GNSS satellites to facilitate positioning techniques such as A-GNSS, AFLT, OTDOA and E-CID. For example, the position information based on the Forward Link Calibration estimates described herein may be provided via the network architecture 600. One or more servers 640 may comprise an almanac which indicates locations and identities of cellular transceivers and/or local transceivers in a particular region or regions such as a particular venue, and may provide information descriptive of signals transmitted by a cellular base station or AP such as transmission power and signal timing. In the case of E-CID, a mobile device 500 may obtain measurements of signal strengths for signals received from cellular transceiver 620 and/or local transceiver 630 and/or may obtain a round trip signal propagation time (RTT) between mobile device 500 and a cellular transceiver 620 or local transceiver 630. A mobile device 500 may use these measurements together with assistance data (e.g. terrestrial almanac data or GNSS satellite data such as GNSS Almanac and/or GNSS Ephemeris information, relative Forward Link Calibration information) received from the one or more servers 640 to determine a location for mobile device 500 or may transfer the measurements to the one or more servers 640 to perform the same determination.

Figure 7A:
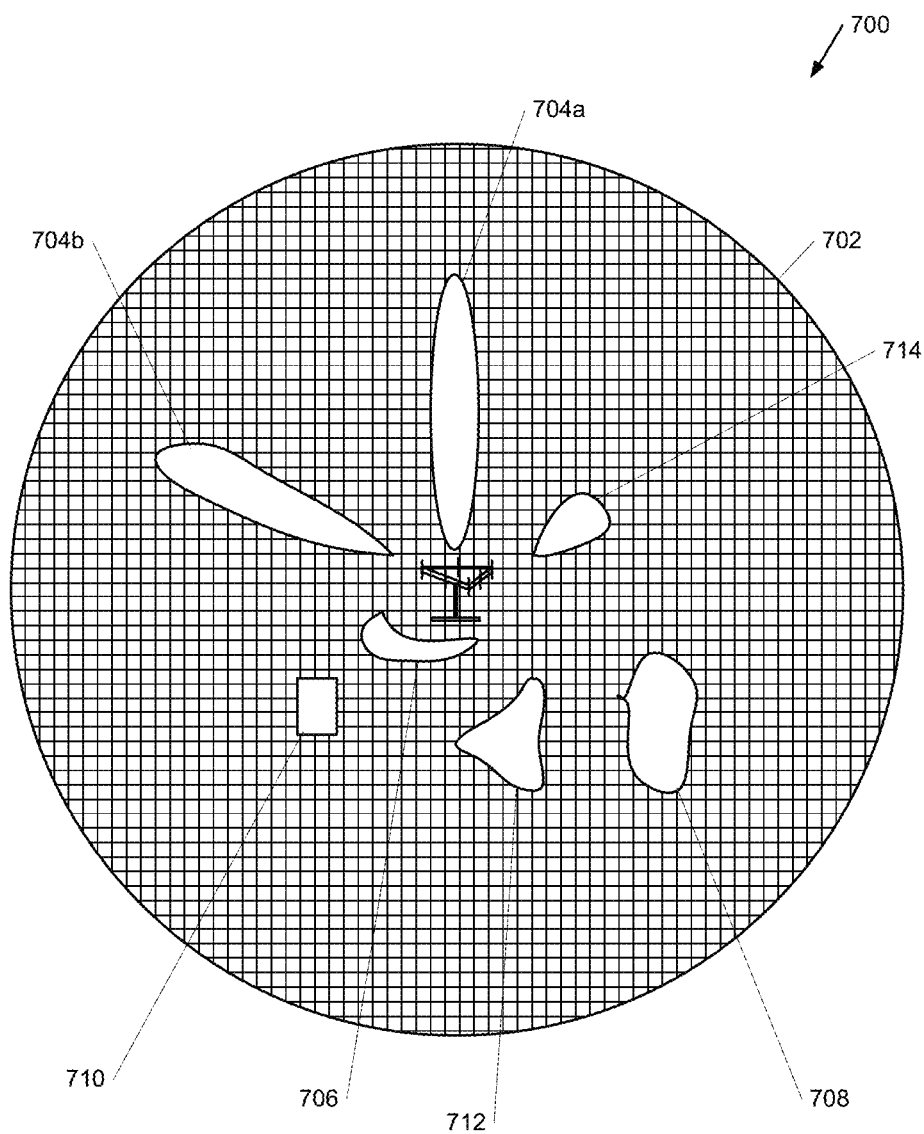
FIG. 7A is an illustration of gridding units.

Referring to FIG. 7A, with further reference to FIG. 3, an illustration 700 of gridding units is shown. A geographic area 702 around a cellular transceiver may be subdivided into smaller geographic units as depicted in FIG. 3. The geographic units may correspond to areas defined by Cartesian or Polar coordinates around the cellular transceiver. For example, as depicted in the illustration 700, the geographic area 702 is subdivided into a Cartesian grid. The geographic units, however, are not limited to grids and may include irregularly shaped areas. For example, areas may also be defined by the propagation of electric and radio signals around the cellular transceiver. Areas based on line-of-sight 704a, 704b from the transceiver and/or areas based on signal strength 706 may be defined. Other propagation considerations may be accounted for, such as an area impacted by multipath propagation 708. Multiple grid areas may be combined to form a larger area 710 to create a statistically relevant dataset (e.g., a larger area may encompass more positioning requests and the corresponding TOA data). An area based on proximity to an access point 712 may be defined. That is, positioning based on other RF sources such as a local transceiver 630 may be sufficient to define a geographic unit. Other areas 714 may also be defined based on relative FLC values. Thus, the shape and size of a geographic unit may vary based on the areas defined in the dataset.

Figure 7B:
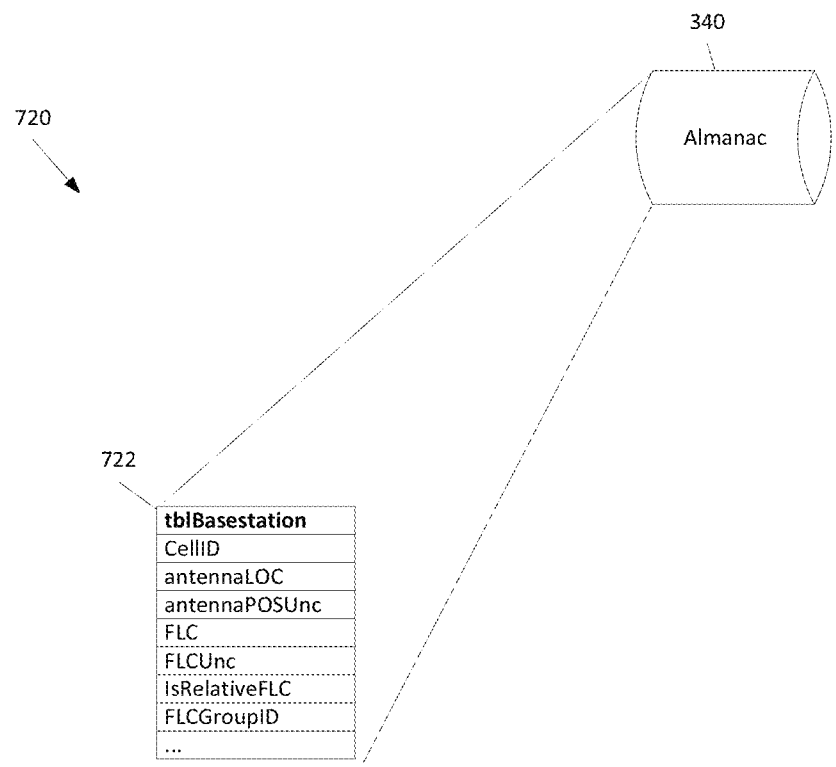
FIG. 7B is an example of a data structure for determining relative FLC values.

Referring to FIG. 7B, an example of a data structure 720 for determining relative FLC values is shown. The data structure 720 may persist on a location server 640 and/or almanac 340. The location server 640 and the almanac 340 may be a single server and thus the terms may be used interchangeably. In an example, the location server 640 and the almanac 340 may be network servers configured to exchange instructions and data. For example, the almanac 340 may include a database application (e.g., Oracle®, SQL®, XML) and is configured to receive instructions from the location server 640. The almanac 340 may include one or more databases including tables, data fields and relationships.

The tables, data fields and relationships depicted on FIG. 7B are exemplary only and not a limitation as other tables, data fields, relationships, indexing schemes, and other database elements may be used. For example, the location server 640 or almanac 340 are configured to receive crowdsourcing data including TOA measurement, user location, and mobile device model type data fields. A reference mobile device model type may be identified. The TOA measurements may be sorted based on grid location and device model type data fields. The location server 640 may be configured to determine, for each grid, a dTcal relative to the reference mobile device model, for each mobile device model type. The location server 640 may be configured to conduct reverse positioning to estimate the cellular transceivers location and an FLC value. The resulting FLC value is a relative FLC (i.e., relative to the reference device model and thus varies if another reference model was selected). The mobile device models with the same reference mobile device model may form a FLC group. The almanac 340 may be configured store the FLC group information. An example base station table 722 may include fields for identifying a cellular transceiver (CellID), information regarding the antenna location for the cellular transceiver such a location and an uncertainty value (e.g., antennaLOC, antennaPOSUnc), and FLC value and an FLC Uncertainty value (FLC, FLCUnc), a field to indicate whether the FLC values is a relative FLC value (IsRelativeFLC), and a FLC Group identifier (FLC-GroupID). The IsRelativeFLC field may be a boolean value (e.g. 0 or 1), and may be used to prevent a mobile device from initiating a Fine Time Transfer if the FLC value is relative. Other fields relating to signal parameters may also be used, such as a connection mode, frequency, and grid identifier. These additional fields allow for variation in the dTcal and dTcal Uncertainty values based on the signal parameters. That is, a relationship between a device model and a reference model may be dependent on connection mode and/or frequency, or other signal parameters.

Figure 8:
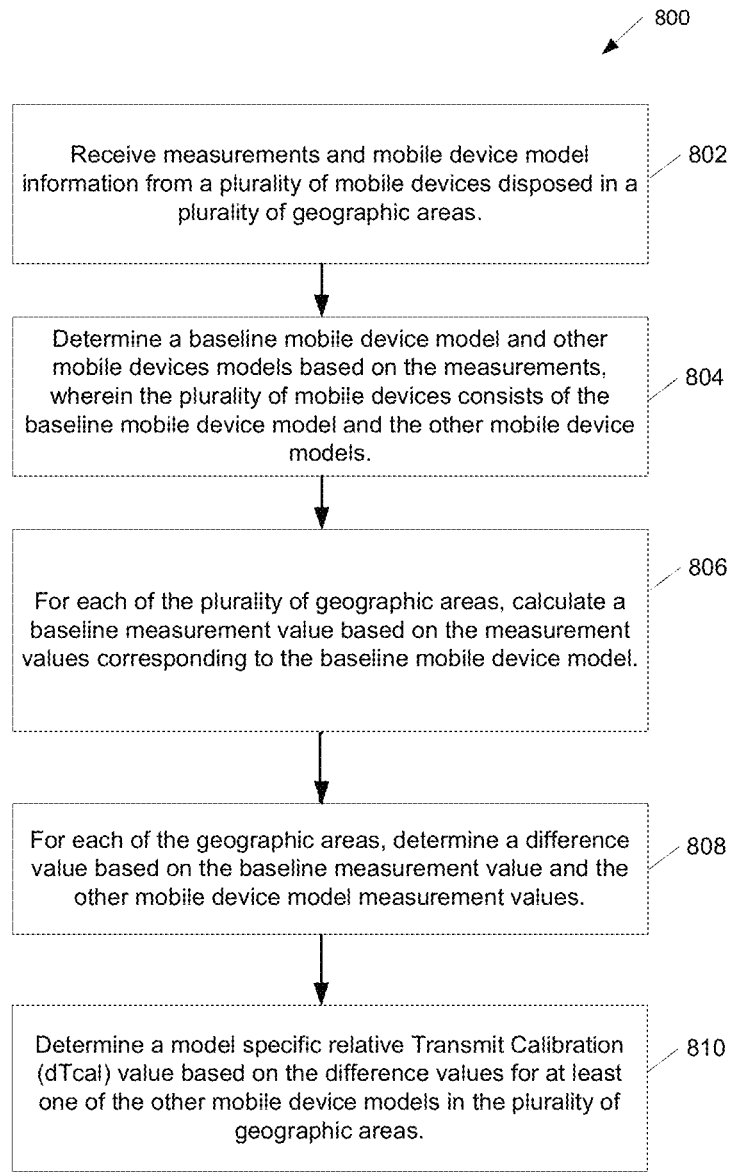
FIG. 8 is a flow diagram of a process for determining a relative Time Calibration (dTcal) value.

Referring to FIG. 8, a process 800 for providing relative FLC information to a mobile device includes the stages shown. The process 800 is, however, an example only and not limiting. The process 800 can be altered, e.g., by having stages added, removed, rearranged, combined, performed concurrently, and/or having single stages split into multiple stages. A location server 640 includes the structure in the computer system 550 and may be a means for performing the process 800.

At stage 802, the location server 640 is configured to receive measurements and mobile device model information from a plurality of mobile devices disposed in a plurality of geographic areas. In an example, the measurements may be Time of Arrival (TOA) measurements. In operation, an individual mobile device 500 may establish a communication link 622 with the cellular transceiver 620. The communication link 622 is configured to support the transfer of mobile device model information, position information, and to enable the capture and transfer of measurements. The location server 640 may be configured to store the mobile device type information and the measurement data in a data structure. In an example, the measurement data may be compensated with an absolute or relative FLC value. The data structure may persist on the location server 640 or on the almanac 340. The location server 640 may aggregate the measurements and position information received from multiple mobile devices. In an example, the location server 640 may be configured to receive measurements based on a timing exchange messages with a mobile device.

At stage 804, the location server 640 is configured to determine a baseline mobile device model and other mobile devices models based on the measurements, wherein the plurality of mobile devices consists of the baseline mobile device model and the other mobile device models. The data structure may be analyzed or sorted based on the mobile device model information to determine a baseline mobile device model. The baseline mobile device model may represent the most popular mobile device model on a network or within a geographic area (e.g., based on unit counts), and/or the mobile device model with a high number of positioning records (e.g., number of records in the data structure). A high number of measurements (e.g., TOA) is a relative term based on content of the data structure and desired performance of a network. For example, a high number of measurements may be a threshold value corresponding to the expected population of a particular mobile device model (e.g., based on sales information) within a region. Thus, a high number need not necessarily be the highest number. The data structure may include one or more data fields associated with other signal parameters, such as deviations in measurement values, average signal strength, channel utilization and frequency which may be used in determining a baseline model type. These data fields may be utilized for determining a baseline mobile device model.

At stage 806, the location server 640 is configured to calculate, for each of the plurality of geographic areas, a baseline measurement value based on the measurement values that correspond to the baseline mobile device model. In an example, the baseline measurement value is the mean of the TOA measurements corresponding to the baseline mobile device model. The data structure may be gridded based on the estimated position of the mobile devices when the measurements are determined. The gridding generally corresponds to geographic areas with similar RF propagation characteristics, and therefore similar FLC values. As the number of records in the data structure increases, the resolution of the gridding may increase and the corresponding geographic area associated with an individual grid space may decrease. Thus, a gridding unit may correspond with a geographic unit, such that the dimensions of the geographic unit may be dynamic based on the number and/or quality of the records in the data structure. Within each gridding unit (e.g., geographic area), the location server 640 may be configured to determine the mean of the measurements received from the mobile devices corresponding to the baseline model type. This result is the baseline measurement value and it is determined for each of the gridding units.

At stage 808, the location server 640 is configured to determine, for each of the geographic areas, a difference value based on the baseline measurement value and the other mobile device model measurement values. In an example, the difference value may be calculated by subtracting the baseline measurement value from the measurements received from the other mobile device models. The baseline measurement value determined at stage 806 is subtracted from each of the measurements received from mobile devices that are not the baseline model (i.e., other mobile device models) in the respective gridding unit. The location server 640 may be configured to perform a subtraction operation on the fields within the data structure. The difference value is the result of the subtraction operation and may persist in the data structure as a field within a signal data record.

At stage 810, the location server 640 is configured to determine a model specific relative Transmit Calibration (dTcal) value based on the difference values for at least one of the other mobile device models in the plurality of geographic areas. In an example, the location server 640 may calculate a model specific relative Time Calibration (dTcal) value as the average of the difference values for at least one of the other mobile device models in the plurality of geographic areas. The location server 640 may be configured to select the difference values associated with a mobile device model type and determine the average of the resulting values. The average of the difference values for a mobile device type is the dTcal value for that mobile device type. An associated dTcal uncertainty value may be defined as the standard deviation of the difference values. The location server 640 is configured to store the dTcal value and the dTcal uncertainty value in the data structure. In an embodiment, the difference values are averaged across the geographic area (i.e., multiple gridding units), thus the dTcal value is dependent only on the mobile device model type (i.e., without a further geographic dependence). In another embodiment, the dTcal value may be dependent both a mobile device model type and a geographic area. The dTcal value may be dependent on other signal parameters such a channel, bandwidth, and/or frequency and may be used to conditionally compensate measurements with the dependencies are satisfied.

Figure 9:
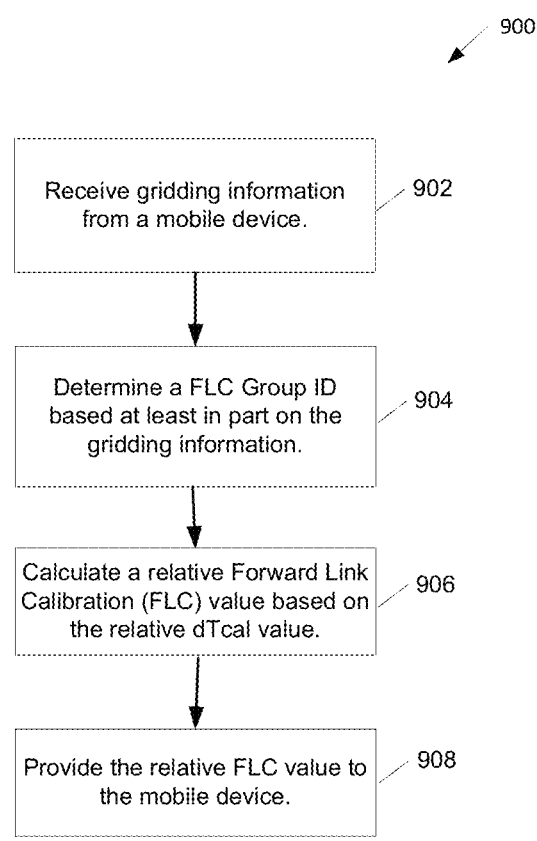
FIG. 9 is a flow diagram of process for providing relative FLC information to a mobile device.

Referring to FIG. 9, a process 900 for providing relative FLC information to a mobile device includes the stages shown. The process 900 is, however, an example only and not limiting. The process 900 can be altered, e.g., by having stages added, removed, rearranged, combined, performed concurrently, and/or having single stages split into multiple stages. A location server 640 includes the structure in the computer system 550 and may be a means for performing the process 900.

At stage 902, the location server 640 is configured to receive gridding information from a mobile device via a cellular transceiver 620. A mobile device 500 may establish a communication link 622 with the cellular transceiver 620. The communication link 622 is configured to support the transfer of gridding information such as TOA data and mobile device model information. In an embodiment, the gridding information may also include position information. The position information may correspond to an a priori position of the mobile device such as with an inertial navigation system. The position information may be a last known location, or other information that may be used to establish an estimated position of the mobile device. The a priori position information may also include derivative information such as neighbor lists, Received Signal Strength Indicator (RSSI) information, or other information which may assist the location server 640 in establishing an estimated location of the mobile device. The mobile device model information may be a numeric or alphanumeric field configured to identify the make and model of the mobile device. Other signal variables such as frequency, bandwidth, and connection mode may also be considered as gridding information.

At stage 904, the location server 640 is configured to determine a FLC Group ID based at least in part on the gridding information. In an embodiment, the gridding information includes mobile device model type information and the location server 640 is configured to query the data structure with an argument including the model type information. The query arguments may optionally include other TOA measurement connection parameters such as frequency, bandwidth, and connection mode. The results of the query include the FLC Group ID value that is associated with the model type and the baseline model type. In an example, the gridding information may include the FLC Group ID.

At stage 906, the location server 640 is configured to calculate a relative Forward Link Calibration (FLC) value based on the FLC Group ID. The data structure 720 includes a collection of relative FLC values corresponding to one or more Cell Id values and FLC Group IDs. The location server 640 may be configured to query the data structure 720 with an argument including a Cell ID and a FLC Group ID, and receive the corresponding relative FLC in the query result. The relative FLC value is used to compensate TOA measurements obtained by a mobile device of the identified mobile device type. At stage 908, the location server 640 is configured to provide the mobile device the relative FLC via the network 625 and the communication link 622. In an example, the location server 640 may provide multiple relative FLC values corresponding to multiple Cell IDs in the received TOA measurement information.

Figure 10:
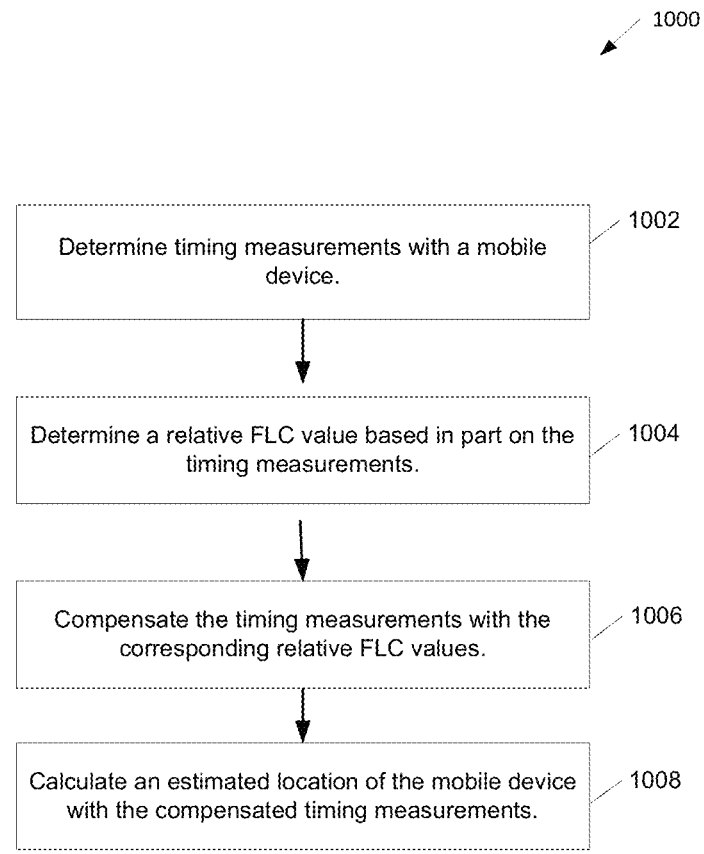
FIG. 10 is a flow diagram of a process for determining an estimated location of a mobile device using relative FLC values.

Referring to FIG. 10, a process 1000 for determining an estimated location of a mobile device using relative FLC values includes the stages shown. The process 1000 is, however, an example only and not limiting. The process 1000 can be altered, e.g., by having stages added, removed, rearranged, combined, performed concurrently, and/or having single stages split into multiple stages. A mobile device 500 may be a means for performing the process 1000.

At stage 1002, a mobile device 500 is configured to determine timing measurements. In an example, the timing measurements may be TOA measurement information. The mobile device 500 may be within the coverage area of one or more cellular transceivers 620, and may communicate with the location server 640 via the communication link 622 and the network 625. The communication link 622 and network 625 are configured to support the transfer of mobile device model information, position information, and to enable the capture and transfer of timing measurements. In an example, the mobile device may store timing measurement information, such as the plurality of timing measurements, locally in the memory 540. In another example, the location server 640 is configured to store the timing measurement data.

At stage 1004, the mobile device 500 is configured to determine a relative Forward Link Calibration (FLC) value for the timing measurements. The timing measurements include an indication of the cellular transceiver (e.g., Cell ID, cellular transceiver identification information), and the location server 640 may be configured to provide FLC Group information based the respective cellular transceiver. The FLC Group information includes the corresponding relative FLC value. In an example, the mobile device 500 is configured to sort the plurality of timing measurements per FLC Group and the number of timing measurements. Timing measurement sets with less than 1 measurement may be ignored. For example, the result of sorting the timing measurements may include identifying one or more sets of TOA measurements based on the FLC Group ID:

TOA set 1(FLCGroupID=2)=[TOA(1),TOA(3),TOA(9),TOA(10)]

where, (TOA(i)=>i is the cell index)

TOA set 2(FLCGroupID=1)=[TOA(2),TOA(4),TOA(6)]

TOA set 3(FLCGroupID=3)=[TOA(5),TOA(7)]

TOA set 4(FLCGroupID=10)=[TOA(8)]=>ignore.

At stage 1006, the mobile device 500 is configured to compensate each of the TOA measurements with the corresponding relative FLC values. Specifically, the timing measurements are compensated in view of the FLC Group ID, and the corresponding mobile device model type from which the timing measurement was obtained. For example, the compensated TOA measurements may be expressed as:

TOAcompByRelativeFLC(i)=TOA(i)−FLC(i) where i is the cell index.

The compensated timing measurement values may be stored locally on the mobile device 500, or remotely on the location server 640.

At stage 1008, the mobile device 500 is configured to calculate an estimated location of the mobile device with the compensated timing measurements. A set of timing measurement values may be used. In an example, if a first compensated timing set has a sufficient number of measurements (e.g., no less than 3), the mobile device 500 is configured to compute a position estimate based on the first compensated timing measurement set. An example positioning method includes trilateration based on weighted least squares (WLS), which may generate the estimated location of the mobile device and a slack variable. The slack variable is typically close to dTcal value for the corresponding device model. In another example, when the timing measurements are TOA measurements, if the first compensated TOA set has an insufficient number of measurements, one or more additional compensated TOA values may be used to calculate the estimated location. In this example, an additional number of slack variables (e.g., one per FLC group) may be generated. The slack variables are expected to be close to dTcal of the device model relative to different reference device model per FLC group. The estimated location may be displayed, or output to for use with a location based service application.

Figure 11:
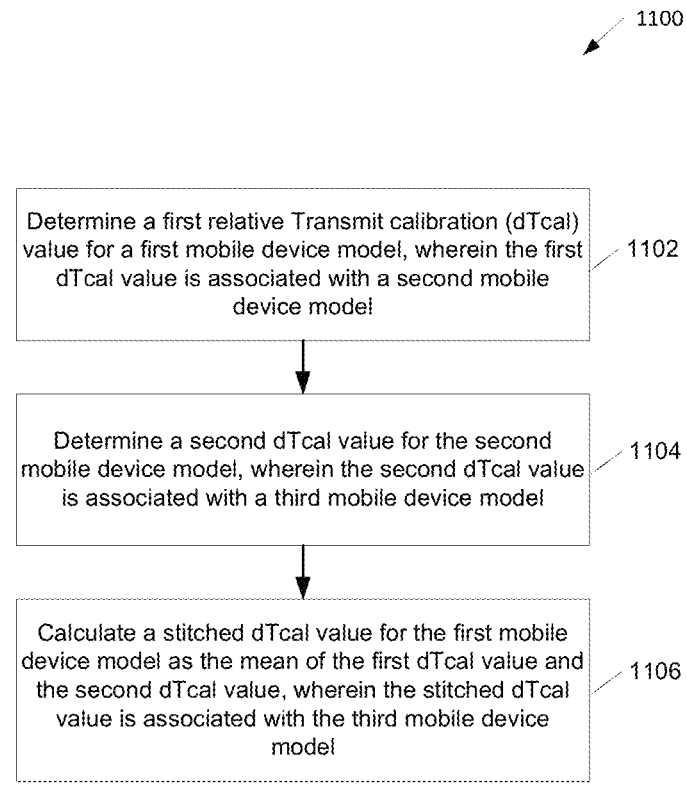
FIG. 11 is a flow diagram of a process for calculating a stitched dTcal value.

Referring to FIG. 11, with further reference to FIG. 4D, a process 1100 for calculating a stitched dTcal value includes the stages shown. The process 1100 is, however, an example only and not limiting. The process 1100 can be altered, e.g., by having stages added, removed, rearranged, combined, performed concurrently, and/or having single stages split into multiple stages. A location server 640 includes the structure in the computer system 550 and may be a means for performing the process 1100.

At stage 1102, the location server 640 is configured to determine a first relative Time Calibration (dTcal) value for a first mobile device model, such that the first dTcal value is associated with a second mobile device model. The dTcal values for the first mobile device relative to the second mobile device are calculated as previously described (i.e., determining the mean TOA difference value), and may be stored in the data structure. The location server 640 is configured to retrieve the corresponding dTcal value based on the relationship between the first mobile device model and the second mobile device model. For example, the relationship AZ 459 represents the dTcal value for mobile device model type 'Z' 460 (e.g., the first mobile device model) that is associated with mobile device model type 'A' 454 (e.g., the second mobile device model).

At stage 1104, the location server 640 is configured to determine a second dTcal value for the second mobile device model, such that the second dTcal value is associated with a third mobile device model. Referring again to FIG. 4D, the relationship AB 453 represents the dTcal value from mobile device model type 'A' 454 (e.g., the second mobile device model) that is associated with mobile device model type B' 452 (e.g., a third mobile device model).

At stage 1106, the location server 640 is configured to calculate a stitched dTcal value for the first mobile device model as the mean of the first dTcal value and the second dTcal value, such that the stitched dTcal value is associated with the third mobile device model. Continuing the example above, the location server is configured to determine the dTcal(ZB) (e.g., the stitched dTcal value) as the mean of (dTcal(ZA)+dTcal(AB)). The stitching provides a relationship (i.e., dTcal value) between mobile device model type 'Z' 460 and mobile device model type 'B' 452 without the need of a direct comparison of the TOA measurements obtained from the type 'Z' and type 'B' devices. For example, if the relationship between the type 'Z' and the type 'A' devices is established in a first network or geographic region, and the relationship between the type 'A' and the type 'B' devices is established in a second network or geographic region, then the stitched dTcal value for the ZB relationship may be used if the type 'B' device is introduced to the first network or geographic region, and if the type 'Z' device is introduced into the second network or geographic region.

Reference throughout this specification to "one example", "an example", "certain examples", or "exemplary implementation" means that a particular feature, structure, or characteristic described in connection with the feature and/or example may be included in at least one feature and/or example of claimed subject matter. Thus, the appearances of the phrase "in one example", "an example", "in certain examples" or "in certain implementations" or other like phrases in various places throughout this specification are not necessarily all referring to the same feature, example, and/or limitation. Furthermore, the particular features, structures, or characteristics may be combined in one or more examples and/or features.

Some portions of the detailed description included herein are presented in terms of algorithms or symbolic representations of operations on binary digital signals stored within a memory of a specific apparatus or special purpose computing device or platform. In the context of this particular specification, the term specific apparatus or the like includes a general purpose computer once it is programmed to perform particular operations pursuant to instructions from program software. Algorithmic descriptions or symbolic representations are examples of techniques used by those of ordinary skill in the signal processing or related arts to convey the substance of their work to others skilled in the art. An algorithm is here, and generally, is considered to be a self-consistent sequence of operations or similar signal processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals, or the like. It should be understood, however, that all of these or similar terms are to be associated with appropriate physical quantities and are merely convenient labels. Unless specifically stated otherwise, as apparent from the discussion herein, it is appreciated that throughout this specification discussions utilizing terms such as "processing," "computing," "calculating," "determining" or the like refer to actions or processes of a specific apparatus, such as a special purpose computer, special purpose computing apparatus or a similar special purpose electronic computing device. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device.

Wireless communication techniques described herein may be in connection with various wireless communications networks such as a wireless wide area network ("WWAN"), a wireless local area network ("WLAN"), a wireless personal area network (WPAN), and so on. The term "network" and "system" may be used interchangeably herein. A WWAN may be a Code Division Multiple Access ("CDMA") network, a Time Division Multiple Access ("TDMA") network, a Frequency Division Multiple Access ("FDMA") network, an Orthogonal Frequency Division Multiple Access ("OFDMA") network, a Single-Carrier Frequency Division Multiple Access ("SC-FDMA") network, or any combination of the above networks, and so on. A CDMA network may implement one or more radio access technologies ("RATs") such as cdma2000, Wideband-CDMA ("W-CDMA"), to name just a few radio technologies. Here, cdma2000 may include technologies implemented according to IS-95, IS-2000, and IS-856 standards. A TDMA network may implement Global System for Mobile Communications ("GSM"), Digital Advanced Mobile Phone System ("D-AMPS"), or some other RAT. GSM and W-CDMA are described in documents from a consortium named "3rd Generation Partnership Project" ("3GPP"). Cdma2000 is described in documents from a consortium named "3rd Generation Partnership Project 2" ("3GPP2"). 3GPP and 3GPP2 documents are publicly available. 4G Long Term Evolution ("LTE") communications networks may also be implemented in accordance with claimed subject matter, in an aspect. A WLAN may comprise an IEEE 802.11x network, and a WPAN may comprise a Bluetooth network, an IEEE 802.15x, for example. Wireless communication implementations described herein may also be used in connection with any combination of WWAN, WLAN or WPAN.

In another aspect, as previously mentioned, a wireless transmitter or access point may comprise a cellular transceiver device, utilized to extend cellular telephone service into a business or home. In such an implementation, one or more mobile devices may communicate with a cellular transceiver device via a code division multiple access ("CDMA") cellular communication protocol, for example.

In the preceding detailed description, numerous specific details have been set forth to provide a thorough understanding of claimed subject matter. However, it will be understood by those skilled in the art that claimed subject matter may be practiced without these specific details. In other instances, methods and apparatuses that would be known by one of ordinary skill have not been described in detail so as not to obscure claimed subject matter.

The terms, "and", "or", and "and/or" as used herein may include a variety of meanings that also are expected to depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein may be used to describe any feature, structure, or characteristic in the singular or may be used to describe a plurality or some other combination of features, structures or characteristics. Though, it should be noted that this is merely an illustrative example and claimed subject matter is not limited to this example.

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein.

Therefore, it is intended that claimed subject matter not be limited to the particular examples disclosed, but that such claimed subject matter may also include all aspects falling within the scope of appended claims, and equivalents thereof.

What is claimed is:

1. An apparatus for determining a relative Time Calibration (dTcal) value for a mobile device model, comprising:
   a memory;
   a receiver configured to receive measurements and a mobile device model information from a plurality of mobile devices disposed in a plurality of geographic areas;
   at least one processor operably coupled to the memory and the receiver, wherein the at least one processor is configured to:
      determine a baseline mobile device model and other mobile device models based on the measurements, wherein the plurality of mobile devices consists of the baseline mobile device model and the other mobile device models;
      calculate a baseline measurement value based on the measurement values that correspond to the baseline mobile device model;

determine a plurality of difference values based on the baseline measurement value and measurement values that correspond to the other mobile device models;

determine a model specific dTcal value based on the plurality of difference values for at least one of the other mobile device models; and store the model specific dTcal value in the memory.

2. The apparatus of claim 1 wherein the at least one processor is further configured to:

calculate a model specific dTcal uncertainty value as a standard deviation of the plurality of difference values for the at least one of the other mobile device models; and store the model specific dTcal uncertainty value in the memory.

3. The apparatus of claim 1 wherein the at least one processor is configured to determine a device model with a high number of measurements as the baseline mobile device model.

4. The apparatus of claim 1 wherein the plurality of geographic areas comprises a grid located in proximity to a cellular transceiver.

5. The apparatus of claim 1 wherein the plurality of geographic areas comprises one or more areas corresponding to a received signal strength value.

6. The apparatus of claim 1 wherein the at least one processor is further configured to generate a Forward Link Calibration (FLC) Group identification based on the baseline mobile device model.

7. The apparatus of claim 1 further comprising a transmitter configured to transmit the model specific dTcal value to the at least one of the other mobile device models.

8. The apparatus of claim 1 wherein the at least one processor is further configured to determine a base station antenna location based at least in part on the model specific dTcal value.

9. A method for determining a relative Time Calibration (dTcal) value for a mobile device model, comprising:

receiving measurements and mobile device model information from a plurality of mobile devices disposed in a plurality of geographic areas;

determining a baseline mobile device model and other mobile device models based on the measurements, wherein the plurality of mobile devices consists of the baseline mobile device model and the other mobile device models;

calculating a baseline measurement value based on the measurement values that correspond to the baseline mobile device model;

determining a plurality of difference values based on the baseline measurement value and measurement values that correspond to the other mobile device models;

determining a model specific dTcal value based on the plurality of difference values for at least one of the other mobile device models; and storing the model specific dTcal value.

10. The method of claim 9 further comprising:

calculating a model specific dTcal uncertainty value as a standard deviation of the plurality of difference values for the at least one of the other mobile device models;

storing the model specific dTcal uncertainty value.

11. The method of claim 9 wherein determining the baseline mobile device model includes determining a device model with a high number of measurements.

12. The method of claim 9 wherein the plurality of geographic areas comprises a grid located in proximity to a cellular transceiver.

13. The method of claim 9 wherein the plurality of geographic areas comprises one or more areas corresponding to a received signal strength value.

14. The method of claim 9 further comprising generating a Forward Link Calibration (FLC) Group identification based on the baseline mobile device model.

15. The method of claim 9 further comprising transmitting the model specific dTcal value to the at least one of the other mobile device models.

16. The method of claim 9 further comprising determining a base station antenna location based at least in part on the model specific dTcal value.

* * * * *